US012708013B2

(12) United States Patent
Marin et al.

(10) Patent No.: US 12,708,013 B2
(45) Date of Patent: Aug. 11, 2026

(54) SUBSTRATE WITH LOW-PERMITTIVITY CORE AND BUILDUP LAYERS

(71) Applicant: Intel Corporation, Santa Clara, CA (US)

(72) Inventors: Brandon Christian Marin, Gilbert, AZ (US); Hamid R. Azimi, Paradise Valley, AZ (US); Sri Chaitra Jyotsna Chavali, Gilbert, AZ (US); Tarek A. Ibrahim, Mesa, AZ (US); Wei-Lun K Jen, Phoenix, AZ (US); Rahul Manepalli, Chandler, AZ (US); Kevin T. McCarthy, Tempe, AZ (US)

(73) Assignee: Intel Corporation, Santa Clara, CA (US)

( * ) Notice: Subject to any disclaimer, the term of this patent is extended or adjusted under 35 U.S.C. 154(b) by 331 days.

(21) Appl. No.: 17/711,749

(22) Filed: Apr. 1, 2022

(65) Prior Publication Data

US 2023/0317592 A1 Oct. 5, 2023

(51) Int. Cl.
*H10W 70/69* (2026.01)
*H10W 70/63* (2026.01)
*H10W 70/685* (2026.01)

(52) U.S. Cl.
CPC ......... *H10W 70/69* (2026.01); *H10W 70/635* (2026.01); *H10W 70/685* (2026.01)

(58) Field of Classification Search
CPC ............ H01L 23/12–15; H05K 1/0366; H05K 1/036; H05K 1/0373; H10W 70/69; H10W 70/635; H10W 70/685; H10W 70/695
See application file for complete search history.

(56) References Cited

U.S. PATENT DOCUMENTS 4,141,055 A * 2/1979 Berry .................. H01L 23/5381 174/253
4,661,301 A * 4/1987 Okada .................. H05K 1/0373 264/108
4,781,968 A * 11/1988 Kellerman ........ H01L 23/49883 428/209
4,784,901 A * 11/1988 Hatakeyama .......... H05K 1/036 428/473.5
4,867,935 A * 9/1989 Morrison, Jr. ........ C03C 14/004 156/89.12
4,998,159 A * 3/1991 Shinohara ............. C04B 35/185 361/809

(Continued)

FOREIGN PATENT DOCUMENTS

CN 110010553 A * 7/2019 ......... H01L 23/5389
EP 0309982 A2 * 4/1989 ......... H01L 23/3737

(Continued)

OTHER PUBLICATIONS

Baney, Ronald H. et al., "Silsesquioxanes," Dow Corning Asia, Ltd., Chem Rev. 1995, 95, 1409-1430, (22 pages).

(Continued)

*Primary Examiner* — Scott B Geyer
(74) *Attorney, Agent, or Firm* — Alliance IP, LLC

(57) ABSTRACT

In one embodiment, a package substrate includes a substrate core, buildup layers, and one or more conductive traces. The substrate core includes at least one dielectric layer with hollow glass fibers. The buildup layers include dielectric layers below and above the substrate core.

23 Claims, 10 Drawing Sheets

(56) References Cited

U.S. PATENT DOCUMENTS 5,178,934 A * 1/1993 Kellerman ............ H01L 23/642 428/209
5,196,384 A * 3/1993 Kamezaki ............ C03C 11/002 501/80
5,275,889 A * 1/1994 Yokouchi ................ H01L 23/15 428/209
5,324,370 A * 6/1994 Aoki ....................... B32B 18/00 156/89.12
5,346,751 A * 9/1994 Lau ................... H01L 23/49894 428/209
5,458,709 A * 10/1995 Kamezaki ............... H01L 23/15 156/89.18
5,785,789 A * 7/1998 Gagnon .................. B32B 27/20 156/230
6,977,060 B1 * 12/2005 Merrill .................... C04B 38/08 419/5
2004/0007784 A1 * 1/2004 Skipor .................... H01L 24/32 257/788
2004/0040738 A1 * 3/2004 Tani ..................... H05K 3/4641 174/250
2007/0077391 A1 * 4/2007 Okamoto ................ B32B 7/027 428/116
2007/0199733 A1 * 8/2007 Murai .................... H05K 3/421 174/250
2008/0164057 A1 * 7/2008 Mori ...................... H05K 3/421 174/262
2010/0254098 A1 * 10/2010 Tsukada ............... H05K 3/0055 174/262
2011/0316148 A1 * 12/2011 Kondo ................ H01L 21/4857 257/737
2012/0132462 A1 * 5/2012 Harazono ................ H05K 3/42 174/260
2013/0052409 A1 * 2/2013 Balcome .................. H05K 3/28 427/96.8
2013/0307162 A1 * 11/2013 Shizuno ................. H05K 3/465 257/774
2015/0027758 A1 * 1/2015 Maeda ................. H05K 1/0298 174/255
2015/0079343 A1 * 3/2015 Nakabayashi ....... H05K 1/0373 428/313.9
2015/0230342 A1 * 8/2015 Hsu ................... H01L 23/49827 29/829
2016/0242280 A1 * 8/2016 Chamberlin ......... H05K 1/0366
2017/0213745 A1 * 7/2017 Kato .................... H05K 3/0058
2018/0094110 A1 * 4/2018 Nakanishi ............ D03D 15/267
2018/0310405 A1 * 10/2018 Iriguchi ................... H05K 3/22
2019/0021175 A1 * 1/2019 Tosaka .................. B32B 15/098
2019/0191559 A1 * 6/2019 Chamberlin ......... H05K 1/0366
2019/0206756 A1 * 7/2019 Kim .................. H01L 23/49827
2019/0380203 A1 * 12/2019 Ota ...................... H05K 1/0366
2020/0056006 A1 * 2/2020 Yokota ...................... C08J 5/249
2020/0239653 A1 * 7/2020 Yoshida .............. H01L 21/4857
2020/0395289 A1 * 12/2020 Kim ........................ H05K 3/007
2021/0171768 A1 * 6/2021 Shim ..................... B32B 15/043
2021/0183784 A1 * 6/2021 Hwang ................ H05K 3/4697
2022/0192018 A1 * 6/2022 Sakai ..................... H05K 1/111
2022/0219357 A1 * 7/2022 Ruisinger ................ C08J 3/203
2023/0397331 A1 * 12/2023 Giesen ................. H05K 1/0366
2024/0381529 A1 * 11/2024 Otake ................... H01L 23/145
2025/0168975 A1 * 5/2025 Nishida .................... H05K 1/02

FOREIGN PATENT DOCUMENTS

EP 1168436 A2 * 1/2002 ......... H01L 21/4857
KR 20170019717 A * 2/2017 ............. H01L 23/12
WO WO-2007114392 A1 * 10/2007 ............. B32B 15/14
WO WO-2020130007 A1 * 6/2020 ............. B32B 5/263

OTHER PUBLICATIONS

Lazzeri, Luigi et al., "Biodegradable Hollow Microfibers to Produce Bioactive Scaffolds," Department of Chemical Engineering, University of Pisa, Pisa Italy, Polymer International; Polym Int 54: 101-107 (2005) (7 pages).

Mato, Yoshinobu et al., "A Versatile Synthetic Strategy for Macromolecular Cages: Intramolecular Consecutive Cyclization of Star-Shaped Polymers," Chemical Science; Chem. Sci. 2019, 10, 440 (7 pages).

* cited by examiner

SUBSTRATE WITH LOW-PERMITTIVITY CORE AND BUILDUP LAYERS

BACKGROUND

High-speed input/output (I/O) is crucial to increasing the speed and performance of integrated circuit devices. HSIO involves high-speed signal transmissions through conductive traces and routes within substrates which integrated circuit devices are electrically attached to. The integrity of high-speed signaling generally suffers from various types of degradation, however, such as insertion loss and crosstalk, which can negatively impact HSIO efficiency.

DETAILED DESCRIPTION

Figure 1:
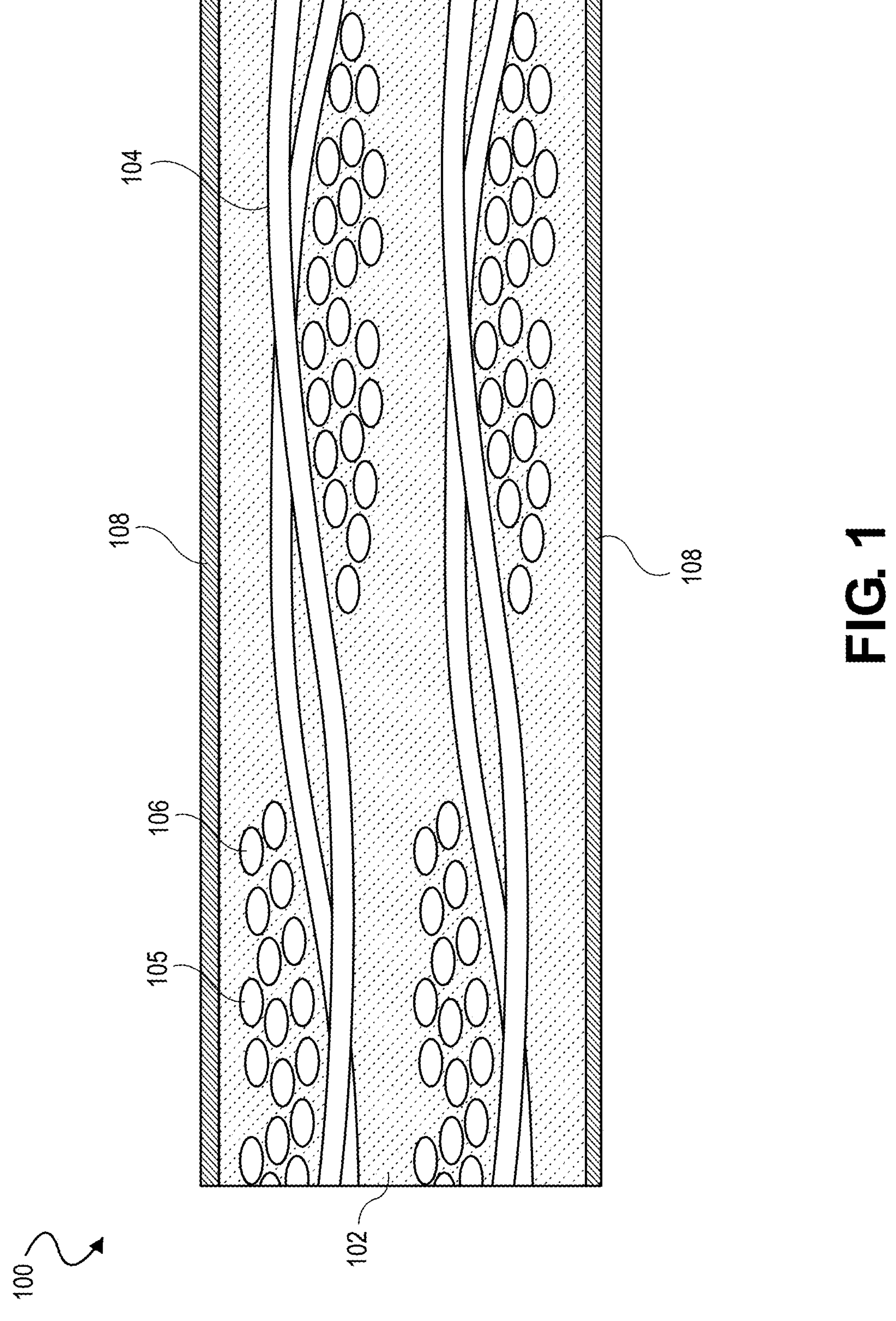
FIG. 1 illustrates a cross-section view of a low-permittivity organic laminate substrate core in accordance with certain embodiments.

The integrated circuit industry is continually striving to produce faster, smaller, and thinner integrated circuit devices for use in various electronic products, including, but not limited to, computer servers and client computing devices, such as desktop computers, portable computers, electronic tablets, cellular phones, digital cameras, and the like. Moreover, high-speed input/output (I/O) is crucial to increasing the speed and performance of integrated circuit devices. HSIO involves high-speed signal transmissions through conductive traces and routes within the substrates to which the integrated circuit devices are electrically attached (which may be collectively referred to as an integrated circuit package).

The integrity of high-speed signaling generally suffers from various types of degradation, however, such as insertion loss and crosstalk. Insertion loss generally refers to the loss of power as a signal travels through conductive traces within a substrate, which is often caused by power dissipation into dielectric layers surrounding the conductive traces. Crosstalk generally refers to signal degradation or interference caused by signals on nearby or adjacent conducive traces.

One way to reduce insertion loss and crosstalk is to reduce the dielectric constant (Dk) and/or dissipation factor (Df) of the dielectric layers surrounding the conductive traces. As a result, substrates with low-permittivity dielectric layers—such as core and buildup layers with low dielectric constants (Dk)—are particularly beneficial for HSIO applications (e.g., SerDes (serializer/deserializer)), as they are less susceptible to insertion loss and crosstalk.

For example, a substrate in an integrated circuit package typically includes an organic core (center layer) surrounded multiple buildup layers (e.g., prepreg, ABF). The core typically includes resin, silica filler, and glass cloth in a laminate. One way to lower the dielectric constant (Dk) of the core is to change the type of glass cloth in the core, which can be tuned to either a low Dk (e.g., using low-dispersion (LD) glass) or a low coefficient of thermal expansion (CTE) (e.g., using S-glass). However, changing the type of glass cloth in the core has limitations on reducing the overall Dk since the volume percentage of glass cloth in the core laminate is limited.

Accordingly, this disclosure presents embodiments of substrates with low-permittivity organic laminate cores and/or buildup layers. In some embodiments, for example, the core and/or buildup layers of a substrate incorporate hollow glass fibers, hollow filler material, and/or air gaps in a dielectric material or resin to reduce the overall effective Dk of the material. In particular, the use of hollow glass cloth, hollow filler, and/or air gaps results in a material with a low dielectric constant (Dk) and high Young's modulus (E).

For example, the hollow glass cloth may include hollow high-strength glass fibers with self-healing coated resin, which results in a high-stiffness dielectric material with an ultra-low dielectric constant (Dk) and dissipation factor (Df). In some embodiments, the hollow glass cloth may also have a thermoplastic coating with a low glass transition temperature (Tg) to provide shielding at vias.

Moreover, hollow filler and/or air gaps can be incorporated into the dielectric material to form hollow pockets, which further reduces the overall Dk. In some embodiments, for example, the dielectric material may include particles of hollow silica filler instead of regular (solid) silica filler. Additionally, or alternatively, the dielectric material may include air gaps formed by cage polymers, such as silsesquioxanes, phenylsilsequioxanes, or polycaprolactones.

The resulting material can be incorporate in certain dielectric layers of a substrate—such as the core and/or buildup layers—to significantly improve their electrical properties and enable more efficient HSIO transmissions (e.g., by reducing insertion loss and crosstalk), which translates into increased speed and performance.

Use of the techniques and structures provided herein may be detectable using tools such as optical microscopy; high resolution physical or chemical analysis; chemical characterization, such as x-ray crystallography or diffraction (XRD), energy-dispersive x-ray spectroscopy (EDX), or Fourier Transform Infrared Spectroscopy (FTIR); scanning/transmission electron microscopy (SEM/TEM), scanning transmission electron microscopy (STEM), nano-beam electron diffraction (NBD or NBED), and reflection electron microscopy (REM); composition mapping; secondary ion mass spectrometry (SIMS); time-of-flight SIMS (ToF-SIMS); atom probe imaging or tomography; local electrode atom probe (LEAP) techniques; and 3D tomography, to name a few suitable example analytical tools. In particular, in some embodiments, these analytic tools may be used to identify a chip-mounting substrate or substrate core that includes (i) hollow glass fibers/cloth and/or (ii) hollow pockets or "air gaps" formed by hollow filler (e.g., hollow silica filler) or cage polymers (e.g., silsesquioxanes, phenylsilsequioxanes, polycaprolactones, and/or other cage polymers), among other examples.

FIG. 1 illustrates a cross-section view of a low-permittivity organic laminate substrate core 100 in accordance with certain embodiments. In the illustrated embodiment, the substrate core 100 includes a dielectric material (e.g., resin) 102 with hollow fibers 104, hollow filler 105, and air gaps 106 in a multi-layer laminate 108, as described further below.

The laminate 108 includes two thin conductive layers or foils above and below the layers of dielectric material 102, such as copper foils or other types of metal foils.

The dielectric material 102 can include any suitable dielectric material, including, but not limited to, epoxy and other resins such as bismaleimide triazine resin, polyimide material, fire retardant grade 4 material, and prepreg materials, as well as low-k and ultra-low-k dielectrics such as carbon doped dielectrics, fluorine doped dielectrics, porous dielectrics, and organic polymeric dielectrics, among other examples.

The hollow fibers 104 provide a balance of structural integrity and low permittivity benefits to the core 100. For example, while the fibers 104 help strengthen the core 100, glass and other types of fibers have high dielectric constants (Dk), which increases the overall permittivity of the core 100. Thus, by using hollow fibers 104, the fibers 104 still provide structural benefits to the core 100, but the volume of high-Dk fiber material is significantly reduced, which lowers the overall permittivity of the core 100.

The hollow fibers 104 in the dielectric material 102 can have various forms. In many embodiments, the hollow fibers 104 include hollow glass fibers, which may be in the form of glass cloth (e.g., a weave of glass fibers), individual fiber filaments, or a combination thereof. Moreover, the hollow glass fibers 104 may be formed of any suitable type or grade of glass, including various grades of glass known in the industry, such as E-glass ("Electrical Grade Glass"), S-glass ("Stiff Grade Glass"), and LD-glass ("Low Dispersion Glass), among other examples. The hollow fibers 104 can additionally or alternatively include other types of fibers, such as quartz or aramid fibers, among other examples.

The hollow filler 105 and air gaps 106 in the dielectric material 102 serve a similar purpose as the hollow fibers 104. In particular, similar to the hollow fibers 104, the hollow filler 105 and air gaps 106 help reduce the overall Dk of the core 100 by increasing the volume of hollow space in the core 100 and displacing the volume of other higher-Dk materials in the core 100. For example, the hollow fibers 104 displace the volume of fiber material (e.g., glass) in the core 100, the hollow filler 105 displaces the volume of filler material (e.g., silica filler) in the core 100, and the air gaps 106 displace the volume of dielectric material 102 (e.g., resin) in the core 100. As a result, the volume of hollow space in the core 100 increases. Moreover, the resulting hollow space may be a vacuum (e.g., space devoid of matter) or may contain gas with a low dielectric constant (Dk), such as air. The dielectric constant of a vacuum is 1 and the dielectric constant of air is slightly above 1, both of which are significantly lower than the dielectric constants of other materials in the core 100. As a result, the use hollow fibers 104, hollow filler 105, and air gaps 106 reduces the overall Dk of the core 100.

The hollow filler 105 and air gaps 106 serve similar purposes and have similar appearances, but their chemical and physical characteristics are different. For example, they both form hollow pockets or "bubbles" in the core 100, which decrease the overall Dk of the core 100. Moreover, their respective bubbles may be similar in size and shape, such as 1-200 nanometers (nm) in diameter in some embodiments. However, the hollow filler 105 is formed by hollow shells made of filler material, while the air gaps 106 are formed by the shape of certain polymers injected in the dielectric material 102.

For example, the hollow filler 105 may be a hollow form of a filler material, such as hollow silica filler. Moreover, each hollow filler particle 105 has a shell made of the particular filler material with a hollow interior pocket or cavity. In this manner, the hollow filler particles 105 form hollow pockets in the core 100, which decreases the overall Dk of the core 100 while still providing similar benefits as solid filler. In various embodiments, the hollow filler 105 may include any suitable filler material, including, but not limited to, silica (silicon dioxide ($SiO_2$)), silicon carbide (SiC), silicon nitride (SiN), or any silicate.

Figures 4A, 4B:
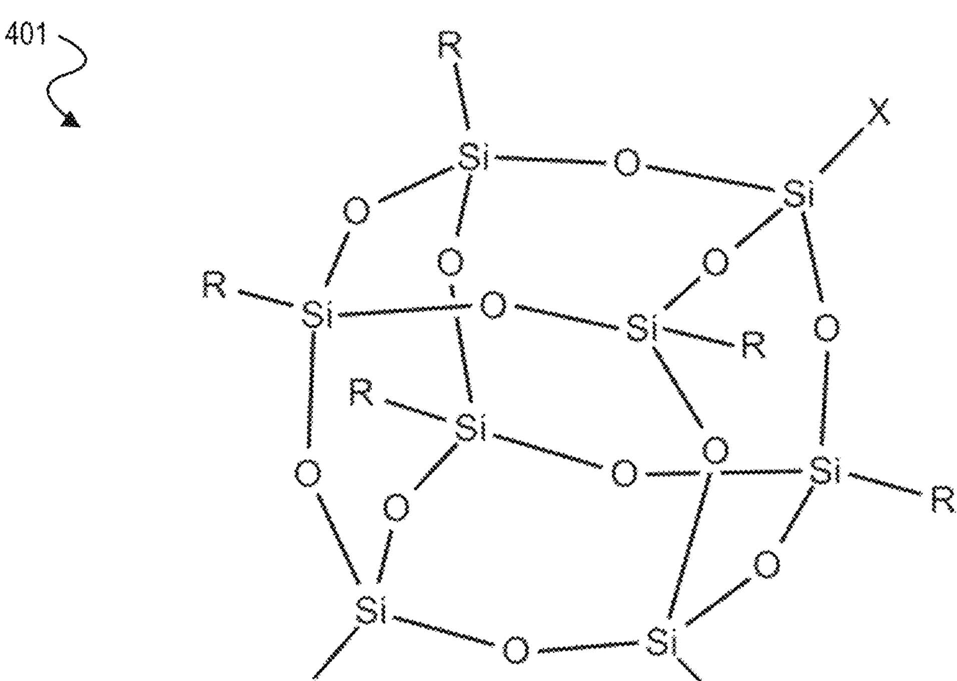
FIGS. 4A-B illustrate examples of various cage polymers for forming air gaps in core and buildup layers of a substrate.

The air gaps 106 are hollow pockets or bubbles formed in the dielectric material 102 using selective chemistry, such as by injecting polymers with certain shapes into the dielectric material 102. In some embodiments, for example, the air gaps 106 may be formed by caged-shape polymers, including, but not limited to, silsesquioxanes, phenylsilsequioxanes, or polycaprolactones (PCLs). In particular, the cage-like structure of these polymers forms air gaps 106 within the dielectric material 102, which may range from 1-200 nm in diameter in some embodiments, depending on the particular polymer. Examples of the cage-like structure of silsesquioxanes and polycaprolactones are shown in FIGS. 4A-B. Moreover, in some embodiments, the polymers may include perfluoro coating to prevent moisture absorption. For example, the air gaps 106 may be formed by hydrophobic functionalized silsesquioxane cages to ensure low moisture uptake, such as cage-like silesquioxane polymers with perfluoro coating.

It will be appreciated that the term "air gap" generally refers to a hollow pocket or bubble in the dielectric material 102, but it does not necessarily mean the pocket is filled with air. Rather, an "air gap" can be an empty space or vacuum (e.g., devoid of matter) or alternatively may be filled with gas, including, but not limited to, air, nitrogen, argon, and the like. The same is true with respect to the hollow spaces formed by the hollow fibers 104 and hollow fillers 105.

In various embodiments, the particular type, combination, or configuration of the dielectric material 102, hollow fibers 104, hollow filler 105, and/or air gaps 106 in the core 100 may be selected or tuned to achieve desired properties, such as a low dielectric constant (Dk), high Young's modulus, and/or suitable coefficient of thermal expansion ("CTE"), and also having appropriate characteristics such as minimum line space ("L/S") capability, and processing requirements, etc. for the application at issue.

In some embodiments, for example, the core 100 may only include some of the described features for reducing the dielectric constant (e.g., only hollow fibers 104, hollow fibers 104 with either hollow filler 105 or air gaps 106, only hollow filler 105, hollow filler 105 with air gaps 106, or only air gaps 106).

Figure 2:
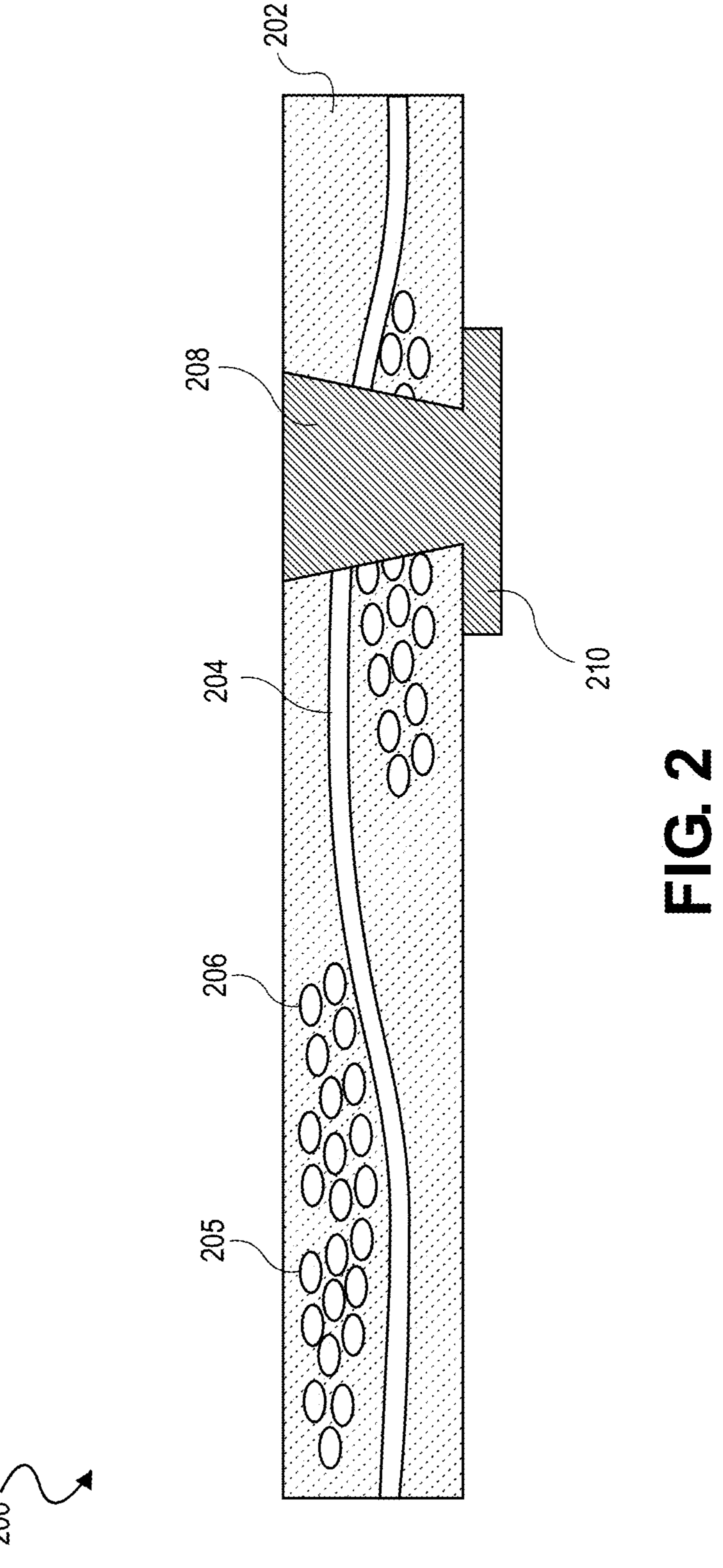
FIG. 2 illustrates a cross-section view of a low-permittivity buildup layer of a substrate in accordance with certain embodiments.

FIG. 2 illustrates a cross-section of a low-permittivity buildup layer 200 of a substrate in accordance with certain embodiments. For example, buildup layers and conductive layers may be formed above and below a substrate core, and patterned with conductive traces, to form a package substrate. Moreover, in some embodiments, certain buildup layers may incorporate the hollow fibers, hollow filler, and/or air gaps described above in connection with the substrate core 100 of FIG. 1. In the illustrated example, buildup layer 200 depicts an example of such a buildup layer. For example, buildup layer 200 includes a dielectric material (e.g., resin) 202 with hollow fibers 204, hollow filler 205, and air gaps 206. Buildup layer 200 also includes a via 208 coupled to a copper pad 210 on the outer surface of the buildup layer 200.

The dielectric material 202 in the buildup layer 200 can include any suitable dielectric material, including, but not limited to, epoxy, polyimide, polyester, or other polymer, combination of polymers, or polymer composites. Example buildup/dielectric materials 202 include: Ajinomoto build up (ABF) film, which may include an epoxy with a phenol hardener, a cyanate ester with an epoxy, or a cyanate ester with a thermosetting olefin; "prepreg," which may include higher filler content dielectric resins impregnated with glass fibers; and "build-up ["BU"] with glass cloth" ("BU-GC"). Example prepreg materials include, but are not limited to, Hitachi GEA679FGR, and Mitsubishi HL-830NSF. Examples of BU-GC dielectric materials that can be used in accordance with any of the embodiments described herein, include build-up dielectric materials marketed under the designators GXT31-GCP and GX92-GCP, manufactured by Ajinomoto Co., Inc. Also note that although referred to herein as a buildup material, such disclosed materials may also be referred to as a microelectronics encapsulant, mold material, mold compound, underfill material, dielectric material, or dielectric resin. All these terms are considered interchangeable as used herein, and generally refer to a dielectric material having certain qualities, such as a certain Dk, CTE, Young's modulus, and/or elongation.

Figure 3:
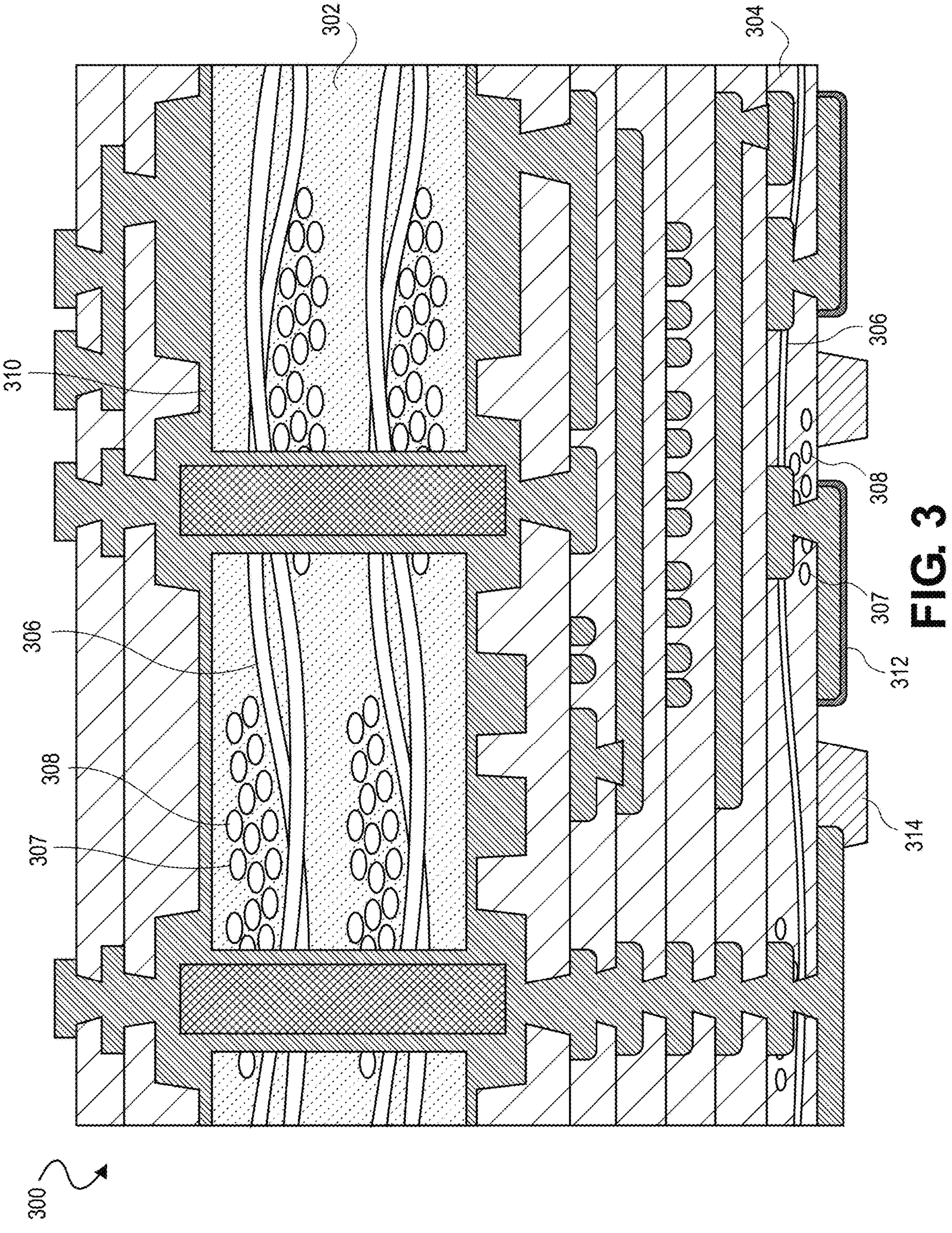
FIG. 3 illustrates a cross-section view of an integrated circuit package substrate with low-permittivity core and buildup layers in accordance with certain embodiments.

FIG. 3 illustrates a cross-section view of an integrated circuit package substrate 300 with low-permittivity core and buildup layers in accordance with certain embodiments. In the illustrated embodiment, the package substrate 300 includes a core 302, buildup layers 304 below and above the core 302, conductive traces 310 through the buildup layers 304 and core 302, and solder resist 314 on the surface of the substrate.

The conductive traces 310 are formed by a combination of conductive (e.g., copper) layers, vias, and contacts (e.g., metal-defined land grid array (LGA) pads 312) formed and patterned within the package substrate 300. The conductive traces may be made of any appropriate conductive material, including but not limited to, metals, such as copper, silver, nickel, gold, and aluminum, alloys thereof, and the like.

In the illustrated embodiment, the core 302 includes hollow glass cloth 306, hollow filler 307, and air gaps 308 to reduce its dielectric constant (Dk) and permittivity, as described in connection with substrate core 100 of FIG. 1.

Further, one of the buildup layers 304 also includes hollow glass cloth 306, hollow filler 307, and air gaps 308, which similarly reduces its dielectric constant (Dk). However, reducing the Dk of the buildup layer 304 also lowers the capacitance of the attached metal defined LGA pads 312, which helps reduce or avoid undesirable effects from built-up capacitance in the pads 312.

In some embodiments, the substrate 300 may be a package substrate that is electrically coupled to one or more integrated circuit (IC) dies (not shown). For example, the IC dies may include, but are not limited to, a semiconductor die, an electronic device (e.g., a wireless device), an integrated circuit (IC) (e.g., a serializer/deserializer (SERDES)), a central processing unit (CPU), a microprocessor, a platform controller hub (PCH), a memory, and/or a field-programmable gate array (FPGA). Moreover, the package substrate may also be electrically coupled to another substrate, such as a printed circuit board or motherboard. In other embodiments, the substrate 300 may be a printed circuit board, a motherboard, or any other type of board.

Moreover, the depicted configuration of core layers, buildup layers, and conductive traces and metallization layers is for illustrative purposes only, and other embodiments may include any number, type, or arrangement of IC layers or structures.

FIGS. 4A-B illustrate examples of various cage polymers 401, 402 for forming air gaps in core and/or buildup layers of a substrate. In particular, FIG. 4A illustrates an example of a silesquioxane polymer 401, and FIG. 4B illustrates an example of a polycaprolactone (PCL) polymer 402. Silsesquioxanes are organosilicon compounds with the chemical formula $(RSiO_{3/2})_n$, where R represents hydrogen, alkyl, aryl, or alkoxyl. Silsesquioxanes have cage-like polymeric structures with Si—O—Si linkages and tetrahedral Si vertices. Silsesquioxanes also have an inorganic silicate core, which provides rigidity and thermal stability, and an organic exterior. Polycaprolactones are cage polymers with the chemical formula $(C_6H_{10}O_2)_n$, which form from star polymer monomers. Polycaprolactones have a low melting point (60° C.) and a low glass transition temperature ($T_g$) (−60° C.).

Figure 5:
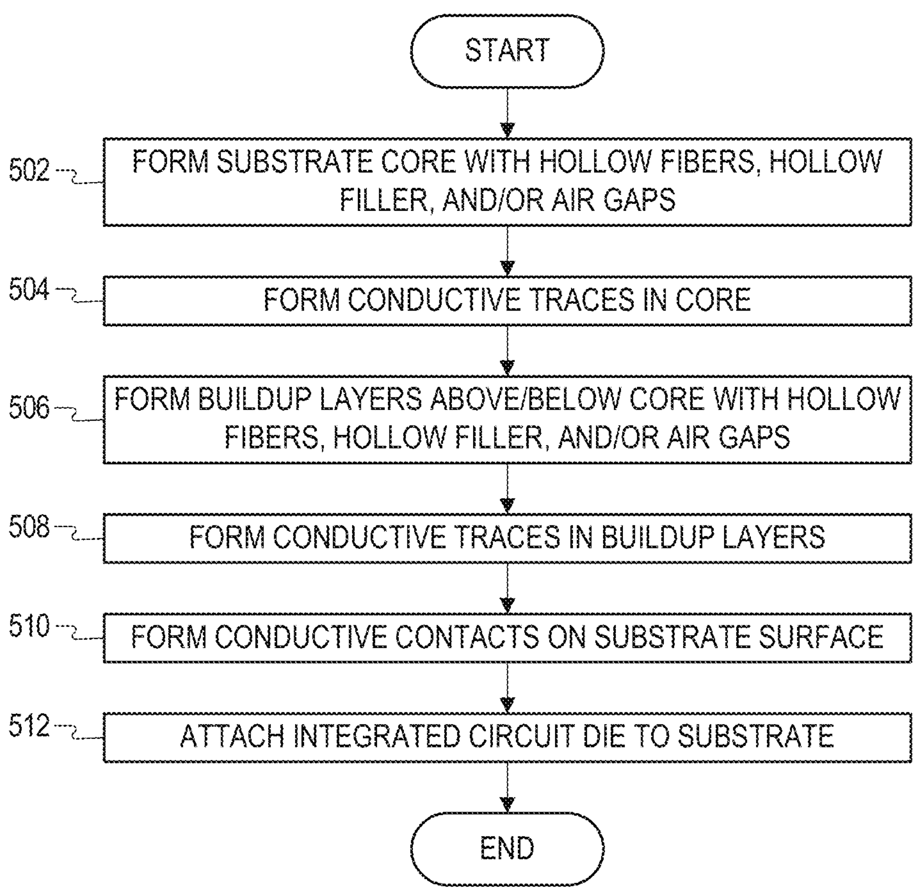
FIG. 5 illustrates a flowchart for forming an integrated circuit package on a substrate with low-permittivity core and/or buildup layers in accordance with certain embodiments.

FIG. 5 illustrates a flowchart 500 for forming an integrated circuit (IC) package on a package substrate with low-permittivity core and/or buildup layers in accordance with certain embodiments. In some embodiments, for example, flowchart 500 may be used to form an IC package on the substrate 300 of FIG. 3. It will be appreciated in light of the present disclosure that flowchart 500 is only one example methodology for arriving at the example substrates, cores, and buildup layers shown and described throughout this disclosure.

The steps of flowchart 500 may be performed using any suitable semiconductor fabrication techniques. For example, film deposition—such as depositing layers, filling portions of layers (e.g., removed portions), and filling via openings—may be performed using any suitable deposition techniques, including, for example, chemical vapor deposition (CVD), metalorganic chemical vapor deposition (MOCVD), molecular beam epitaxy (MBE) atomic layer deposition (ALD), and/or physical vapor deposition (PVD). Moreover, patterning and removal—such as interconnect patterning, forming via openings, and shaping—may be performed using any suitable techniques, such as lithography-based patterning/masking and/or etching.

The flowchart begins at block 502 by providing or forming a substrate core with hollow fibers, hollow filler, and/or air gaps. For example, the substrate core may include one or more dielectric layers within a laminate, such as between two copper foil layers. Moreover, the dielectric layer(s) may include a dielectric material with hollow fibers, hollow filler, and/or air gaps.

In some embodiments, the hollow fibers may include hollow glass fibers, either in the form of individual fiber filaments or a glass cloth weave. Further, the hollow glass fibers or glass cloth may also have a thermoplastic coating with a low glass transition temperature ($T_g$) to provide shielding at vias in the core. In some embodiments, hollow glass cloth can be pulled/weaved using combustion or sintering methods, and then integrated into the organic core using standard processing techniques.

Moreover, the dielectric layers may include hollow pockets formed by the hollow filler and/or air gaps in the dielectric material. For example, the hollow filler may include holler filler particles (e.g., hollow spherical silica fillers) with external shells made of a filler material and interior cavities within the shells that form hollow pockets. Similarly, the air gaps may be formed by the cage-like structure of certain cage polymers within the dielectric material, which similarly form hollow pockets within the cage polymers. In some embodiments, the cage polymers may include silesquioxane polymers, phenylsilsequioxane polymers, or polycaprolactone polymers.

The flowchart then proceeds to block 504 to form conductive traces in the core (e.g., through hole vias).

The flowchart then proceeds to block 506 to form buildup layers above and below the core, optionally with hollow fibers, hollow filler, and/or air gaps in some (or all) buildup layers. For example, the buildup layers may be dielectric or prepreg layers, with at least one below the core and one above the core. Moreover, the buildup layers may include at least one layer that contains hollow fibers or hollow pockets (e.g., due to hollow filler or air gaps formed by cage polymers).

The flowchart then proceeds to block 508 to form conductive traces within the buildup layers. For example, the conductive traces may include conductive layers formed between the buildup layers, vias patterned in the buildup layers (e.g., through hole vias, blind vias, buried vias), and so forth.

The flowchart then proceeds to block 510 to form conductive contacts (e.g., metal pads) on the surface of the package substrate. The completed package substrate may collectively include the core, buildup layers, and conductive traces (e.g., the collection of conductive layers, vias, and contacts).

The flowchart then proceeds to block 512 to attach one or more integrated circuit (IC) dies to the package substrate. For example, the package substrate and IC die(s) may be assembled such that the conductive contacts on the IC die(s) are electrically coupled to the conductive contacts on the surface of the package substrate. In some embodiments, the IC die(s) may include processing circuitry (e.g., CPUs, GPUs, accelerators, FPGAs), memory circuitry (e.g., non-volatile or volatile memory or storage), and/or communication circuitry (network interface controllers, I/O controllers and hubs), among other examples. The completed IC package may subsequently be attached to a printed circuit board or another integrated circuit substrate or device.

At this point, the flowchart may be complete. In some embodiments, however, the flowchart may restart and/or certain blocks may be repeated. For example, in some embodiments, the flowchart may restart at block 502 to continue forming another integrated circuit package on a substrate with the same or similar design.

Figure 6:
FIG. 6 illustrates a graph of insertion loss resonances in organic cores with normal dielectric constants.
Figure 6:
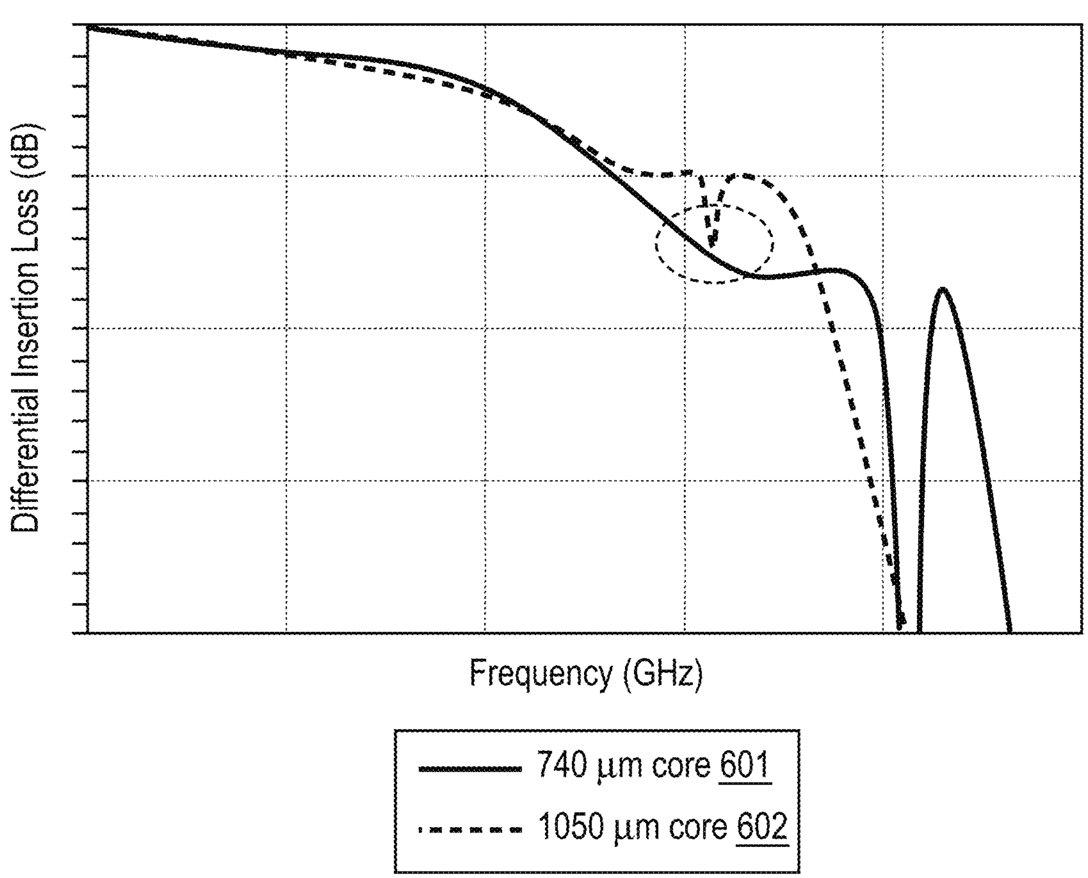

FIG. 6 illustrates a graph 600 of insertion loss resonances in organic cores 601, 602 with normal dielectric constants (e.g., Dk>4) and respective thicknesses of 750 μm and 1050 μm. In particular, the cores 601, 602 do not include the hollow glass cloth, hollow filler, or air gap features described herein for reducing permittivity. Moreover, as shown by graph 600, the cores 601, 602 suffer from insertion loss, which could be alleviated by incorporating the hollow glass cloth, hollow filler, and air gap features described herein.

Example Integrated Circuit Embodiments

Figure 7:
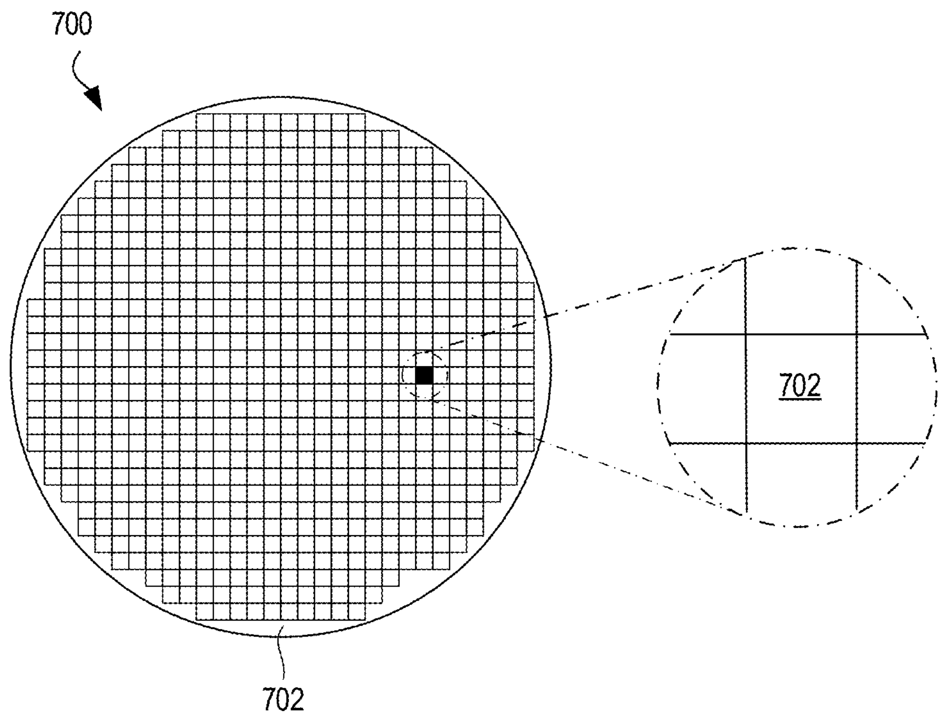
FIG. 7 is a top view of a wafer and dies that may be included in a microelectronic assembly, in accordance with any of the embodiments disclosed herein.

FIG. 7 is a top view of a wafer 700 and dies 702 that may be included in any of the embodiments disclosed herein. The wafer 700 may be composed of semiconductor material and may include one or more dies 702 having integrated circuit structures formed on a surface of the wafer 700. The individual dies 702 may be a repeating unit of an integrated circuit product that includes any suitable integrated circuit. After the fabrication of the semiconductor product is complete, the wafer 700 may undergo a singulation process in which the dies 702 are separated from one another to provide discrete "chips" of the integrated circuit product. The die 702 may be any of the dies disclosed herein. The die 702 may include one or more transistors (e.g., some of the transistors 840 of FIG. 8, discussed below), supporting circuitry to route electrical signals to the transistors, passive components (e.g., signal traces, resistors, capacitors, or inductors), and/or any other integrated circuit components. In some embodiments, the wafer 700 or the die 702 may include a memory device (e.g., a random access memory (RAM) device, such as a static RAM (SRAM) device, a magnetic RAM (MRAM) device, a resistive RAM (RRAM) device, a conductive-bridging RAM (CBRAM) device, etc.), a logic device (e.g., an AND, OR, NAND, or NOR gate), or any other suitable circuit element. Multiple ones of these devices may be combined on a single die 702. For example, a memory array formed by multiple memory devices may be formed on a same die 702 as a processor unit (e.g., the processor unit 1002 of FIG. 10) or other logic that is configured to store information in the memory devices or execute instructions stored in the memory array. Various ones of the microelectronic assemblies disclosed herein may be manufactured using a die-to-wafer assembly technique in which some dies are attached to a wafer 700 that include others of the dies, and the wafer 700 is subsequently singulated.

Figure 8:
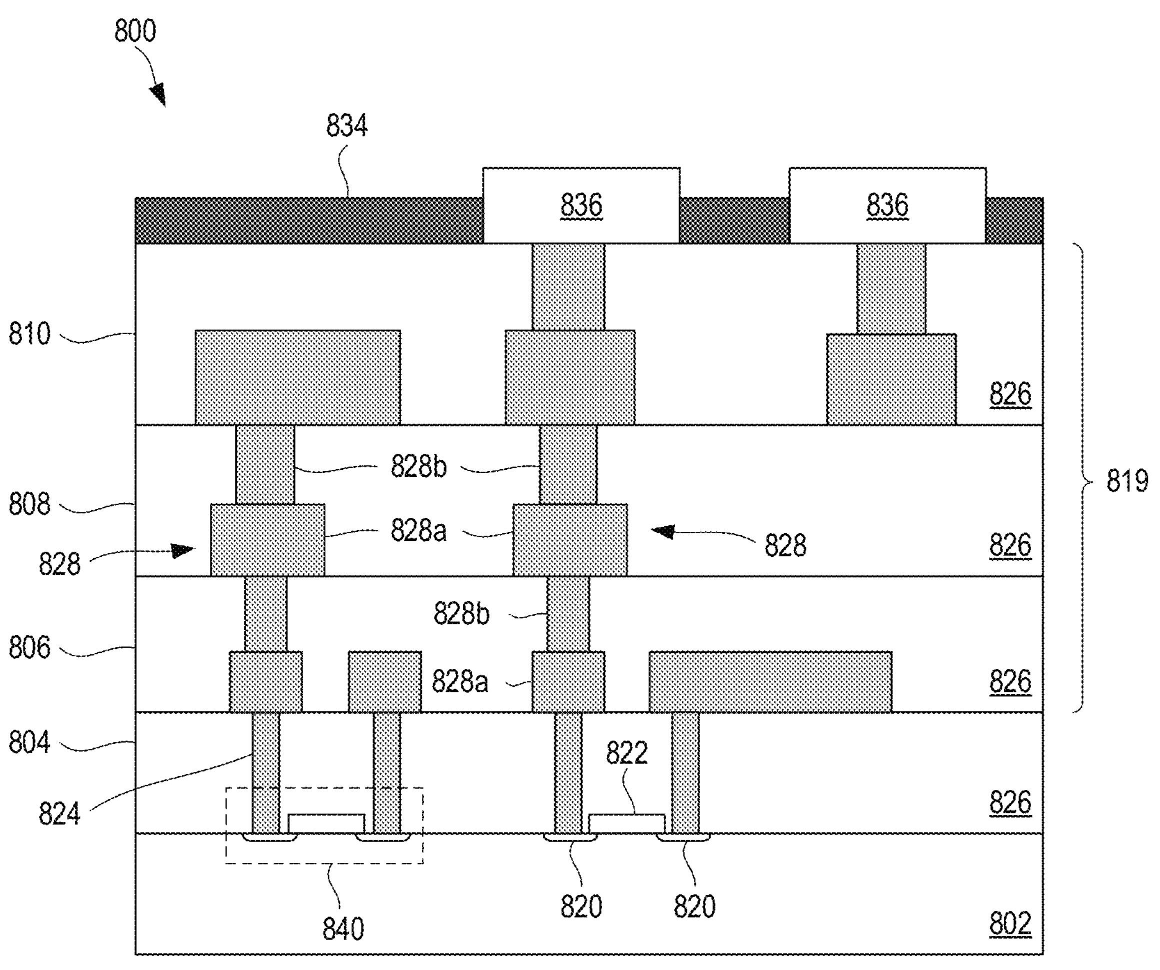
FIG. 8 is a cross-sectional side view of an integrated circuit device that may be included in a microelectronic assembly, in accordance with any of the embodiments disclosed herein.

FIG. 8 is a cross-sectional side view of an integrated circuit device 800 that may be included in any of the embodiments disclosed herein (e.g., in any of the dies). One or more of the integrated circuit devices 800 may be included in one or more dies 702 (FIG. 7). The integrated circuit device 800 may be formed on a die substrate 802 (e.g., the wafer 700 of FIG. 7) and may be included in a die (e.g., the die 702 of FIG. 7). The die substrate 802 may be a semiconductor substrate composed of semiconductor material systems including, for example, n-type or p-type materials systems (or a combination of both). The die substrate 802 may include, for example, a crystalline substrate formed using a bulk silicon or a silicon-on-insulator (SOI) substructure. In some embodiments, the die substrate 802 may be formed using alternative materials, which may or may not be combined with silicon, that include, but are not limited to, germanium, indium antimonide, lead telluride, indium arsenide, indium phosphide, gallium arsenide, or gallium antimonide. Further materials classified as group II-VI, III-V, or IV may also be used to form the die substrate 802. Although a few examples of materials from which the die substrate 802 may be formed are described here, any material that may serve as a foundation for an integrated circuit device 800 may be used. The die substrate 802 may be part of a singulated die (e.g., the dies 702 of FIG. 7) or a wafer (e.g., the wafer 700 of FIG. 7).

The integrated circuit device 800 may include one or more device layers 804 disposed on the die substrate 802. The device layer 804 may include features of one or more transistors 840 (e.g., metal oxide semiconductor field-effect transistors (MOSFETs)) formed on the die substrate 802. The transistors 840 may include, for example, one or more source and/or drain (S/D) regions 820, a gate 822 to control current flow between the S/D regions 820, and one or more S/D contacts 824 to route electrical signals to/from the S/D regions 820. The transistors 840 may include additional features not depicted for the sake of clarity, such as device isolation regions, gate contacts, and the like. The transistors 840 are not limited to the type and configuration depicted in FIG. 8 and may include a wide variety of other types and configurations such as, for example, planar transistors, non-planar transistors, or a combination of both. Non-planar transistors may include FinFET transistors, such as double-gate transistors or tri-gate transistors, and wrap-around or all-around gate transistors, such as nanoribbon, nanosheet, or nanowire transistors.

Returning to FIG. 8, a transistor 840 may include a gate 822 formed of at least two layers, a gate dielectric and a gate electrode. The gate dielectric may include one layer or a stack of layers. The one or more layers may include silicon oxide, silicon dioxide, silicon carbide, and/or a high-k dielectric material.

The high-k dielectric material may include elements such as hafnium, silicon, oxygen, titanium, tantalum, lanthanum, aluminum, zirconium, barium, strontium, yttrium, lead, scandium, niobium, and zinc. Examples of high-k materials that may be used in the gate dielectric include, but are not limited to, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate. In some embodiments, an annealing process may be carried out on the gate dielectric to improve its quality when a high-k material is used.

The gate electrode may be formed on the gate dielectric and may include at least one p-type work function metal or n-type work function metal, depending on whether the transistor 840 is to be a p-type metal oxide semiconductor (PMOS) or an n-type metal oxide semiconductor (NMOS) transistor. In some implementations, the gate electrode may consist of a stack of two or more metal layers, where one or more metal layers are work function metal layers and at least one metal layer is a fill metal layer. Further metal layers may be included for other purposes, such as a barrier layer.

For a PMOS transistor, metals that may be used for the gate electrode include, but are not limited to, ruthenium, palladium, platinum, cobalt, nickel, conductive metal oxides (e.g., ruthenium oxide), and any of the metals discussed below with reference to an NMOS transistor (e.g., for work function tuning). For an NMOS transistor, metals that may be used for the gate electrode include, but are not limited to, hafnium, zirconium, titanium, tantalum, aluminum, alloys of these metals, carbides of these metals (e.g., hafnium carbide, zirconium carbide, titanium carbide, tantalum carbide, and aluminum carbide), and any of the metals discussed above with reference to a PMOS transistor (e.g., for work function tuning).

In some embodiments, when viewed as a cross-section of the transistor 840 along the source-channel-drain direction, the gate electrode may consist of a U-shaped structure that includes a bottom portion substantially parallel to the surface of the die substrate 802 and two sidewall portions that are substantially perpendicular to the top surface of the die substrate 802. In other embodiments, at least one of the metal layers that form the gate electrode may simply be a planar layer that is substantially parallel to the top surface of the die substrate 802 and does not include sidewall portions substantially perpendicular to the top surface of the die substrate 802. In other embodiments, the gate electrode may consist of a combination of U-shaped structures and planar, non-U-shaped structures. For example, the gate electrode may consist of one or more U-shaped metal layers formed atop one or more planar, non-U-shaped layers.

In some embodiments, a pair of sidewall spacers may be formed on opposing sides of the gate stack to bracket the gate stack. The sidewall spacers may be formed from materials such as silicon nitride, silicon oxide, silicon carbide, silicon nitride doped with carbon, and silicon oxynitride. Processes for forming sidewall spacers are well known in the art and generally include deposition and etching process steps. In some embodiments, a plurality of spacer pairs may be used; for instance, two pairs, three pairs, or four pairs of sidewall spacers may be formed on opposing sides of the gate stack.

The S/D regions 820 may be formed within the die substrate 802 adjacent to the gate 822 of individual transistors 840. The S/D regions 820 may be formed using an implantation/diffusion process or an etching/deposition process, for example. In the former process, dopants such as boron, aluminum, antimony, phosphorous, or arsenic may be ion-implanted into the die substrate 802 to form the S/D regions 820. An annealing process that activates the dopants and causes them to diffuse farther into the die substrate 802 may follow the ion-implantation process. In the latter process, the die substrate 802 may first be etched to form recesses at the locations of the S/D regions 820. An epitaxial deposition process may then be carried out to fill the recesses with material that is used to fabricate the S/D regions 820. In some implementations, the S/D regions 820 may be fabricated using a silicon alloy such as silicon germanium or silicon carbide. In some embodiments, the epitaxially deposited silicon alloy may be doped in situ with dopants such as boron, arsenic, or phosphorous. In some embodiments, the S/D regions 820 may be formed using one or more alternate semiconductor materials such as germanium or a group III-V material or alloy. In further embodiments, one or more layers of metal and/or metal alloys may be used to form the S/D regions 820.

Electrical signals, such as power and/or input/output (I/O) signals, may be routed to and/or from the devices (e.g., transistors 840) of the device layer 804 through one or more interconnect layers disposed on the device layer 804 (illustrated in FIG. 8 as interconnect layers 806-810). For example, electrically conductive features of the device layer 804 (e.g., the gate 822 and the S/D contacts 824) may be electrically coupled with the interconnect structures 828 of the interconnect layers 806-810. The one or more interconnect layers 806-810 may form a metallization stack (also referred to as an "ILD stack") 819 of the integrated circuit device 800.

The interconnect structures 828 may be arranged within the interconnect layers 806-810 to route electrical signals according to a wide variety of designs; in particular, the arrangement is not limited to the particular configuration of interconnect structures 828 depicted in FIG. 8. Although a particular number of interconnect layers 806-810 is depicted in FIG. 8, embodiments of the present disclosure include integrated circuit devices having more or fewer interconnect layers than depicted.

In some embodiments, the interconnect structures 828 may include lines 828*a* and/or vias 828*b* filled with an electrically conductive material such as a metal. The lines 828*a* may be arranged to route electrical signals in a direction of a plane that is substantially parallel with a surface of the die substrate 802 upon which the device layer 804 is formed. For example, the lines 828*a* may route electrical signals in a direction in and out of the page and/or in a direction across the page from the perspective of FIG. 8. The vias 828*b* may be arranged to route electrical signals in a direction of a plane that is substantially perpendicular to the surface of the die substrate 802 upon which the device layer 804 is formed. In some embodiments, the vias 828*b* may electrically couple lines 828*a* of different interconnect layers 806-810 together.

The interconnect layers 806-810 may include a dielectric material 826 disposed between the interconnect structures 828, as shown in FIG. 8. In some embodiments, dielectric material 826 disposed between the interconnect structures 828 in different ones of the interconnect layers 806-810 may have different compositions; in other embodiments, the composition of the dielectric material 826 between different interconnect layers 806-810 may be the same. The device layer 804 may include a dielectric material 826 disposed between the transistors 840 and a bottom layer of the metallization stack as well. The dielectric material 826 included in the device layer 804 may have a different composition than the dielectric material 826 included in the interconnect layers 806-810; in other embodiments, the composition of the dielectric material 826 in the device layer 804 may be the same as a dielectric material 826 included in any one of the interconnect layers 806-810.

A first interconnect layer 806 (referred to as Metal 1 or "M1") may be formed directly on the device layer 804. In some embodiments, the first interconnect layer 806 may include lines 828*a* and/or vias 828*b*, as shown. The lines 828*a* of the first interconnect layer 806 may be coupled with contacts (e.g., the S/D contacts 824) of the device layer 804. The vias 828*b* of the first interconnect layer 806 may be coupled with the lines 828*a* of a second interconnect layer 808.

The second interconnect layer 808 (referred to as Metal 2 or "M2") may be formed directly on the first interconnect layer 806. In some embodiments, the second interconnect layer 808 may include via 828*b* to couple the lines 828 of the second interconnect layer 808 with the lines 828*a* of a third interconnect layer 810. Although the lines 828*a* and the vias 828*b* are structurally delineated with a line within individual interconnect layers for the sake of clarity, the lines 828*a* and the vias 828*b* may be structurally and/or materially contiguous (e.g., simultaneously filled during a dual-damascene process) in some embodiments.

The third interconnect layer 810 (referred to as Metal 3 or "M3") (and additional interconnect layers, as desired) may be formed in succession on the second interconnect layer 808 according to similar techniques and configurations described in connection with the second interconnect layer 808 or the first interconnect layer 806. In some embodiments, the interconnect layers that are "higher up" in the metallization stack 819 in the integrated circuit device 800 (i.e., farther away from the device layer 804) may be thicker that the interconnect layers that are lower in the metallization stack 819, with lines 828*a* and vias 828*b* in the higher interconnect layers being thicker than those in the lower interconnect layers.

The integrated circuit device 800 may include a solder resist material 834 (e.g., polyimide or similar material) and one or more conductive contacts 836 formed on the interconnect layers 806-810. In FIG. 8, the conductive contacts 836 are illustrated as taking the form of bond pads. The conductive contacts 836 may be electrically coupled with the interconnect structures 828 and configured to route the electrical signals of the transistor(s) 840 to external devices. For example, solder bonds may be formed on the one or more conductive contacts 836 to mechanically and/or electrically couple an integrated circuit die including the integrated circuit device 800 with another component (e.g., a printed circuit board). The integrated circuit device 800 may include additional or alternate structures to route the electrical signals from the interconnect layers 806-810; for example, the conductive contacts 836 may include other analogous features (e.g., posts) that route the electrical signals to external components. The conductive contacts 836 may serve as any of the conductive contacts described throughout this disclosure.

In some embodiments in which the integrated circuit device 800 is a double-sided die, the integrated circuit device 800 may include another metallization stack (not shown) on the opposite side of the device layer(s) 804. This metallization stack may include multiple interconnect layers as discussed above with reference to the interconnect layers 806-810, to provide conductive pathways (e.g., including conductive lines and vias) between the device layer(s) 804 and additional conductive contacts (not shown) on the opposite side of the integrated circuit device 800 from the conductive contacts 836. These additional conductive contacts may serve as any of the conductive contacts described throughout this disclosure.

In other embodiments in which the integrated circuit device 800 is a double-sided die, the integrated circuit device 800 may include one or more through silicon vias (TSVs) through the die substrate 802; these TSVs may make contact with the device layer(s) 804, and may provide conductive pathways between the device layer(s) 804 and additional conductive contacts (not shown) on the opposite side of the integrated circuit device 800 from the conductive contacts 836. These additional conductive contacts may serve as any of the conductive contacts described throughout this disclosure. In some embodiments, TSVs extending through the substrate can be used for routing power and ground signals from conductive contacts on the opposite side of the integrated circuit device 800 from the conductive contacts 836 to the transistors 840 and any other components integrated into the die 800, and the metallization stack 819 can be used to route I/O signals from the conductive contacts 836 to transistors 840 and any other components integrated into the die 800.

Multiple integrated circuit devices 800 may be stacked with one or more TSVs in the individual stacked devices providing connection between one of the devices to any of the other devices in the stack. For example, one or more high-bandwidth memory (HBM) integrated circuit dies can be stacked on top of a base integrated circuit die and TSVs in the HBM dies can provide connection between the individual HBM and the base integrated circuit die. Conductive contacts can provide additional connections between adjacent integrated circuit dies in the stack. In some embodiments, the conductive contacts can be fine-pitch solder bumps (microbumps).

Figure 9:
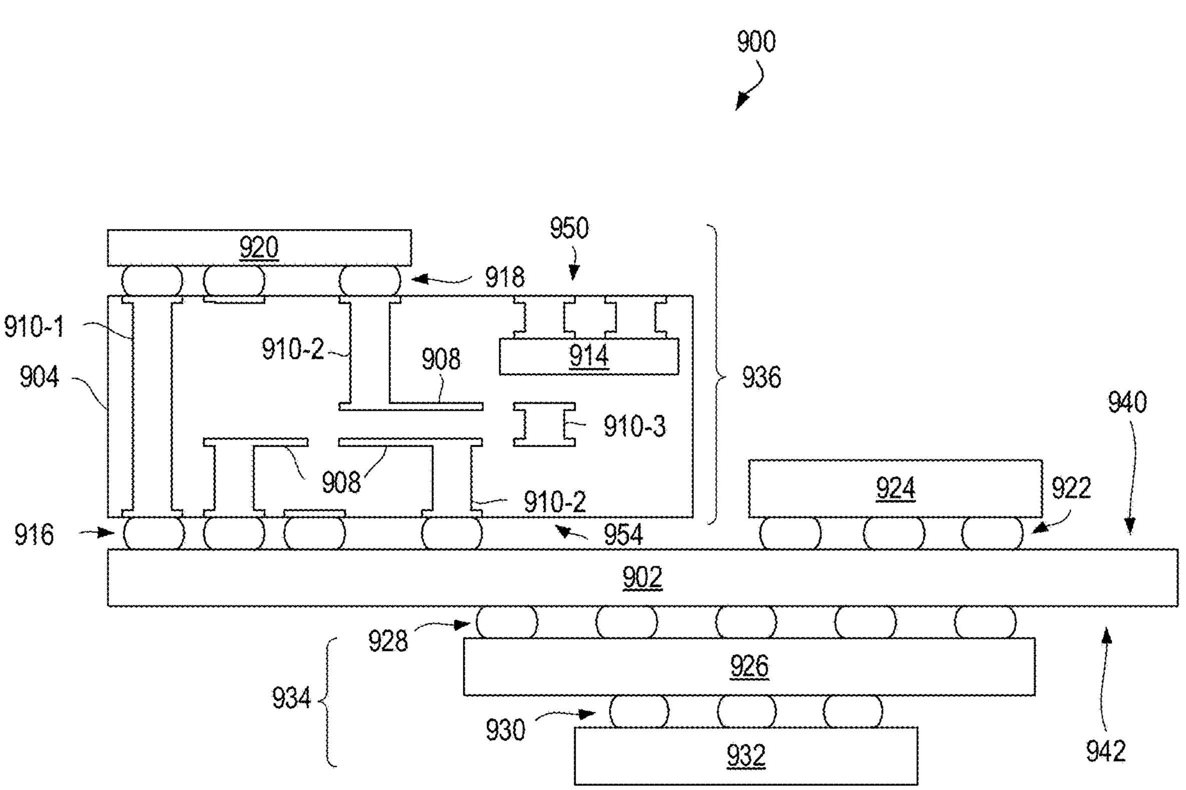
FIG. 9 is a cross-sectional side view of an integrated circuit device assembly that may include a microelectronic assembly, in accordance with any of the embodiments disclosed herein.

FIG. 9 is a cross-sectional side view of an integrated circuit device assembly 900 that may include any of the embodiments disclosed herein. In some embodiments, the integrated circuit device assembly 900 may be a microelectronic assembly. The integrated circuit device assembly 900 includes a number of components disposed on a circuit board 902 (which may be a motherboard, system board, mainboard, etc.). The integrated circuit device assembly 900 includes components disposed on a first face 940 of the circuit board 902 and an opposing second face 942 of the circuit board 902; generally, components may be disposed on one or both faces 940 and 942. Any of the integrated circuit components discussed below with reference to the integrated circuit device assembly 900 may take the form of any suitable ones of the embodiments of the microelectronic assemblies 100 disclosed herein.

In some embodiments, the circuit board 902 may be a printed circuit board (PCB) including multiple metal (or interconnect) layers separated from one another by layers of dielectric material and interconnected by electrically conductive vias. The individual metal layers comprise conductive traces. Any one or more of the metal layers may be formed in a desired circuit pattern to route electrical signals (optionally in conjunction with other metal layers) between the components coupled to the circuit board 902. In other embodiments, the circuit board 902 may be a non-PCB substrate. The integrated circuit device assembly 900 illustrated in FIG. 9 includes a package-on-interposer structure 936 coupled to the first face 940 of the circuit board 902 by coupling components 916. The coupling components 916 may electrically and mechanically couple the package-on-interposer structure 936 to the circuit board 902, and may include solder balls (as shown in FIG. 9), pins (e.g., as part of a pin grid array (PGA), contacts (e.g., as part of a land grid array (LGA)), male and female portions of a socket, an adhesive, an underfill material, and/or any other suitable electrical and/or mechanical coupling structure. The coupling components 916 may serve as the coupling components illustrated or described for any of the substrate assembly or substrate assembly components described herein, as appropriate.

The package-on-interposer structure 936 may include an integrated circuit component 920 coupled to an interposer 904 by coupling components 918. The coupling components 918 may take any suitable form for the application, such as the forms discussed above with reference to the coupling components 916. Although a single integrated circuit component 920 is shown in FIG. 9, multiple integrated circuit components may be coupled to the interposer 904; indeed, additional interposers may be coupled to the interposer 904. The interposer 904 may provide an intervening substrate used to bridge the circuit board 902 and the integrated circuit component 920.

The integrated circuit component 920 may be a packaged or unpacked integrated circuit product that includes one or more integrated circuit dies (e.g., the die 702 of FIG. 7, the integrated circuit device 800 of FIG. 8) and/or one or more other suitable components. A packaged integrated circuit component comprises one or more integrated circuit dies mounted on a package substrate with the integrated circuit dies and package substrate encapsulated in a casing material, such as a metal, plastic, glass, or ceramic. In one example of an unpackaged integrated circuit component 920, a single monolithic integrated circuit die comprises solder bumps attached to contacts on the die. The solder bumps allow the die to be directly attached to the interposer 904. The integrated circuit component 920 can comprise one or more computing system components, such as one or more processor units (e.g., system-on-a-chip (SoC), processor core, graphics processor unit (GPU), accelerator, chipset processor), I/O controller, memory, or network interface controller. In some embodiments, the integrated circuit component 920 can comprise one or more additional active or passive devices such as capacitors, decoupling capacitors, resistors, inductors, fuses, diodes, transformers, sensors, electrostatic discharge (ESD) devices, and memory devices.

In embodiments where the integrated circuit component 920 comprises multiple integrated circuit dies, they dies can be of the same type (a homogeneous multi-die integrated circuit component) or of two or more different types (a heterogeneous multi-die integrated circuit component). A multi-die integrated circuit component can be referred to as a multi-chip package (MCP) or multi-chip module (MCM).

In addition to comprising one or more processor units, the integrated circuit component 920 can comprise additional components, such as embedded DRAM, stacked high bandwidth memory (HBM), shared cache memories, input/output (I/O) controllers, or memory controllers. Any of these additional components can be located on the same integrated circuit die as a processor unit, or on one or more integrated circuit dies separate from the integrated circuit dies comprising the processor units. These separate integrated circuit dies can be referred to as “chiplets”. In embodiments where an integrated circuit component comprises multiple integrated circuit dies, interconnections between dies can be provided by the package substrate, one or more silicon interposers, one or more silicon bridges embedded in the package substrate (such as Intel® embedded multi-die interconnect bridges (EMIBs)), or combinations thereof.

Generally, the interposer 904 may spread connections to a wider pitch or reroute a connection to a different connection. For example, the interposer 904 may couple the integrated circuit component 920 to a set of ball grid array (BGA) conductive contacts of the coupling components 916 for coupling to the circuit board 902. In the embodiment illustrated in FIG. 9, the integrated circuit component 920 and the circuit board 902 are attached to opposing sides of the interposer 904; in other embodiments, the integrated circuit component 920 and the circuit board 902 may be attached to a same side of the interposer 904. In some embodiments, three or more components may be interconnected by way of the interposer 904.

In some embodiments, the interposer 904 may be formed as a PCB, including multiple metal layers separated from one another by layers of dielectric material and interconnected by electrically conductive vias. In some embodiments, the interposer 904 may be formed of an epoxy resin, a fiberglass-reinforced epoxy resin, an epoxy resin with inorganic fillers, a ceramic material, or a polymer material such as polyimide. In some embodiments, the interposer 904 may be formed of alternate rigid or flexible materials that may include the same materials described above for use in a semiconductor substrate, such as silicon, germanium, and other group III-V and group IV materials. The interposer 904 may include metal interconnects 908 and vias 910, including but not limited to through hole vias 910-1 (that extend from a first face 950 of the interposer 904 to a second face 954 of the interposer 904), blind vias 910-2 (that extend from the first or second faces 950 or 954 of the interposer 904 to an internal metal layer), and buried vias 910-3 (that connect internal metal layers).

In some embodiments, the interposer 904 can comprise a silicon interposer. Through silicon vias (TSV) extending through the silicon interposer can connect connections on a first face of a silicon interposer to an opposing second face of the silicon interposer. In some embodiments, an interposer 904 comprising a silicon interposer can further comprise one or more routing layers to route connections on a first face of the interposer 904 to an opposing second face of the interposer 904.

The interposer 904 may further include embedded devices 914, including both passive and active devices. Such devices may include, but are not limited to, capacitors, decoupling capacitors, resistors, inductors, fuses, diodes, transformers, sensors, electrostatic discharge (ESD) devices, and memory devices. More complex devices such as radio frequency devices, power amplifiers, power management devices, antennas, arrays, sensors, and microelectromechanical systems (MEMS) devices may also be formed on the interposer 904. The package-on-interposer structure 936 may take the form of any of the package-on-interposer structures known in the art. In embodiments where the interposer is a non-printed circuit board The integrated circuit device assembly 900 may include an integrated circuit component 924 coupled to the first face 940 of the circuit board 902 by coupling components 922. The coupling components 922 may take the form of any of the embodiments discussed above with reference to the coupling components 916, and the integrated circuit component 924 may take the form of any of the embodiments discussed above with reference to the integrated circuit component 920.

The integrated circuit device assembly 900 illustrated in FIG. 9 includes a package-on-package structure 934 coupled to the second face 942 of the circuit board 902 by coupling components 928. The package-on-package structure 934 may include an integrated circuit component 926 and an integrated circuit component 932 coupled together by coupling components 930 such that the integrated circuit component 926 is disposed between the circuit board 902 and the integrated circuit component 932. The coupling components 928 and 930 may take the form of any of the embodiments of the coupling components 916 discussed above, and the integrated circuit components 926 and 932 may take the form of any of the embodiments of the integrated circuit component 920 discussed above. The package-on-package structure 934 may be configured in accordance with any of the package-on-package structures known in the art.

Figure 10:
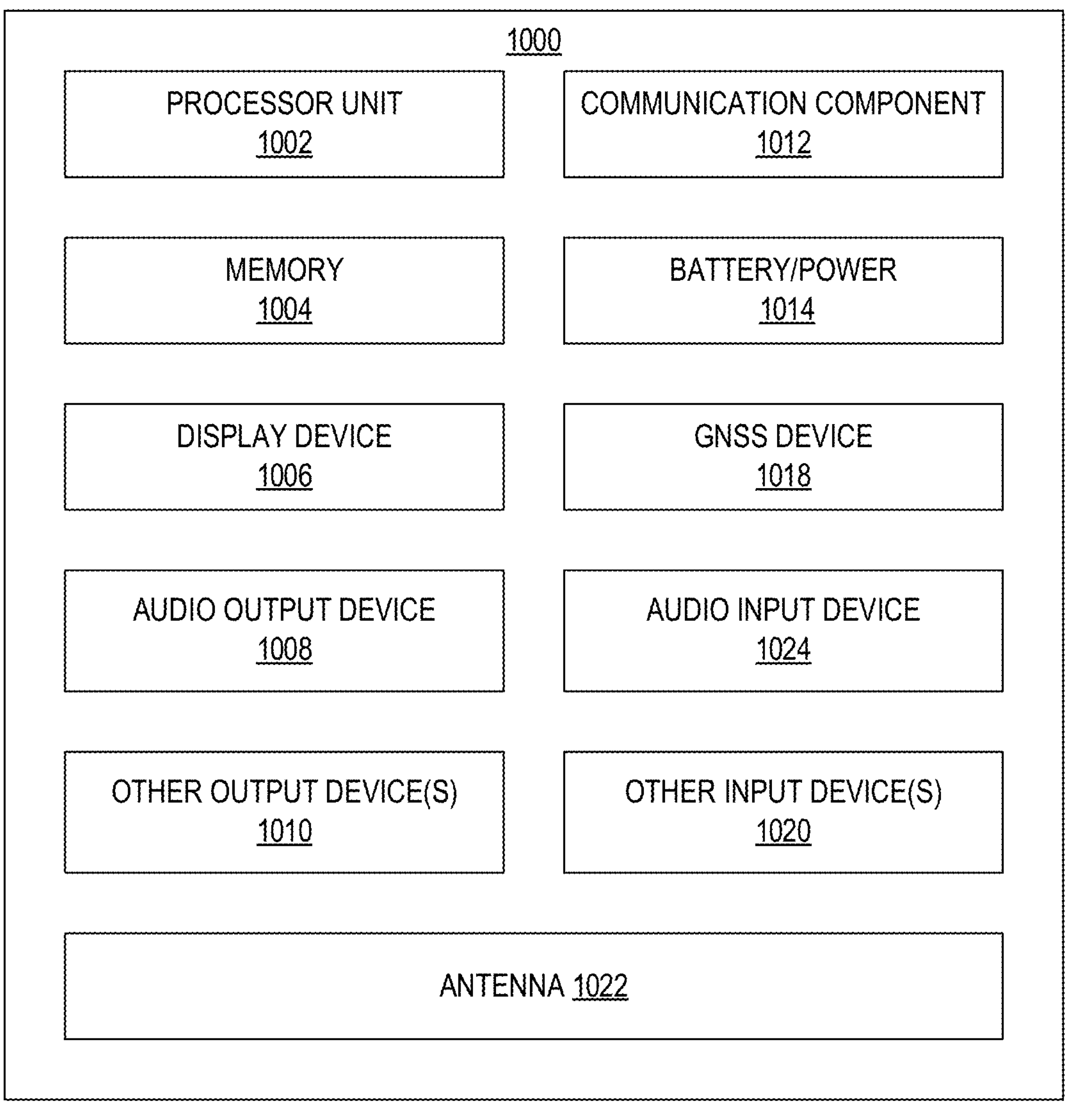
FIG. 10 is a block diagram of an example electrical device that may include a microelectronic assembly, in accordance with any of the embodiments disclosed herein.

FIG. 10 is a block diagram of an example electrical device 1000 that may include one or more of the embodiments disclosed herein. For example, any suitable ones of the components of the electrical device 1000 may include one or more of the substrate cores 100, package substrates 300, integrated circuit packages and device assemblies 900, integrated circuit components 920, integrated circuit devices 800, or integrated circuit dies 702 disclosed herein. A number of components are illustrated in FIG. 10 as included in the electrical device 1000, but any one or more of these components may be omitted or duplicated, as suitable for the application. In some embodiments, some or all of the components included in the electrical device 1000 may be attached to one or more motherboards mainboards, or system boards. In some embodiments, one or more of these components are fabricated onto a single system-on-a-chip (SoC) die.

Additionally, in various embodiments, the electrical device 1000 may not include one or more of the components illustrated in FIG. 10, but the electrical device 1000 may include interface circuitry for coupling to the one or more components. For example, the electrical device 1000 may not include a display device 1006, but may include display device interface circuitry (e.g., a connector and driver circuitry) to which a display device 1006 may be coupled. In another set of examples, the electrical device 1000 may not include an audio input device 1024 or an audio output device 1008, but may include audio input or output device interface circuitry (e.g., connectors and supporting circuitry) to which an audio input device 1024 or audio output device 1008 may be coupled.

The electrical device 1000 may include one or more processor units 1002 (e.g., one or more processor units). As used herein, the terms "processor unit", "processing unit" or "processor" may refer to any device or portion of a device that processes electronic data from registers and/or memory to transform that electronic data into other electronic data that may be stored in registers and/or memory. The processor unit 1002 may include one or more digital signal processors (DSPs), application-specific integrated circuits (ASICs), central processing units (CPUs), graphics processing units (GPUs), general-purpose GPUs (GPGPUs), accelerated processing units (APUs), field-programmable gate arrays (FPGAs), neural network processing units (NPUs), data processor units (DPUs), accelerators (e.g., graphics accelerator, compression accelerator, artificial intelligence accelerator), controller cryptoprocessors (specialized processors that execute cryptographic algorithms within hardware), server processors, controllers, or any other suitable type of processor units. As such, the processor unit can be referred to as an XPU (or xPU).

The electrical device 1000 may include a memory 1004, which may itself include one or more memory devices such as volatile memory (e.g., dynamic random access memory (DRAM), static random-access memory (SRAM)), non-volatile memory (e.g., read-only memory (ROM), flash memory, chalcogenide-based phase-change non-voltage memories), solid state memory, and/or a hard drive. In some embodiments, the memory 1004 may include memory that is located on the same integrated circuit die as the processor unit 1002. This memory may be used as cache memory (e.g., Level 1 (L1), Level 2 (L2), Level 3 (L3), Level 4 (L4), Last Level Cache (LLC)) and may include embedded dynamic random access memory (eDRAM) or spin transfer torque magnetic random access memory (STT-MRAM).

In some embodiments, the electrical device 1000 can comprise one or more processor units 1002 that are heterogeneous or asymmetric to another processor unit 1002 in the electrical device 1000. There can be a variety of differences between the processing units 1002 in a system in terms of a spectrum of metrics of merit including architectural, microarchitectural, thermal, power consumption characteristics, and the like. These differences can effectively manifest themselves as asymmetry and heterogeneity among the processor units 1002 in the electrical device 1000.

In some embodiments, the electrical device 1000 may include a communication component 1012 (e.g., one or more communication components). For example, the communication component 1012 can manage wireless communications for the transfer of data to and from the electrical device 1000. The term "wireless" and its derivatives may be used to describe circuits, devices, systems, methods, techniques, communications channels, etc., that may communicate data through the use of modulated electromagnetic radiation through a nonsolid medium. The term "wireless" does not imply that the associated devices do not contain any wires, although in some embodiments they might not.

The communication component 1012 may implement any of a number of wireless standards or protocols, including but not limited to Institute for Electrical and Electronic Engineers (IEEE) standards including Wi-Fi (IEEE 802.11 family), IEEE 802.16 standards (e.g., IEEE 802.16-2005 Amendment), Long-Term Evolution (LTE) project along with any amendments, updates, and/or revisions (e.g., advanced LTE project, ultra mobile broadband (UMB) project (also referred to as "3GPP2"), etc.). IEEE 802.16 compatible Broadband Wireless Access (BWA) networks are generally referred to as WiMAX networks, an acronym that stands for Worldwide Interoperability for Microwave Access, which is a certification mark for products that pass conformity and interoperability tests for the IEEE 802.16 standards. The communication component 1012 may operate in accordance with a Global System for Mobile Communication (GSM), General Packet Radio Service (GPRS), Universal Mobile Telecommunications System (UMTS), High Speed Packet Access (HSPA), Evolved HSPA (E-HSPA), or LTE network. The communication component 1012 may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). The communication component 1012 may operate in accordance with Code Division Multiple Access (CDMA), Time Division Multiple Access (TDMA), Digital Enhanced Cordless Telecommunications (DECT), Evolution-Data Optimized (EV-DO), and derivatives thereof, as well as any other wireless protocols that are designated as 3G, 4G, 5G, and beyond. The communication component 1012 may operate in accordance with other wireless protocols in other embodiments. The electrical device 1000 may include an antenna 1022 to facilitate wireless communications and/or to receive other wireless communications (such as AM or FM radio transmissions).

In some embodiments, the communication component 1012 may manage wired communications, such as electrical, optical, or any other suitable communication protocols (e.g., IEEE 802.3 Ethernet standards). As noted above, the communication component 1012 may include multiple communication components. For instance, a first communication component 1012 may be dedicated to shorter-range wireless communications such as Wi-Fi or Bluetooth, and a second communication component 1012 may be dedicated to longer-range wireless communications such as global positioning system (GPS), EDGE, GPRS, CDMA, WiMAX, LTE, EV-DO, or others. In some embodiments, a first communication component 1012 may be dedicated to wireless communications, and a second communication component 1012 may be dedicated to wired communications.

The electrical device 1000 may include battery/power circuitry 1014. The battery/power circuitry 1014 may include one or more energy storage devices (e.g., batteries or capacitors) and/or circuitry for coupling components of the electrical device 1000 to an energy source separate from the electrical device 1000 (e.g., AC line power).

The electrical device 1000 may include a display device 1006 (or corresponding interface circuitry, as discussed above). The display device 1006 may include one or more embedded or wired or wirelessly connected external visual indicators, such as a heads-up display, a computer monitor, a projector, a touchscreen display, a liquid crystal display (LCD), a light-emitting diode display, or a flat panel display.

The electrical device 1000 may include an audio output device 1008 (or corresponding interface circuitry, as discussed above). The audio output device 1008 may include any embedded or wired or wirelessly connected external device that generates an audible indicator, such speakers, headsets, or earbuds.

The electrical device 1000 may include an audio input device 1024 (or corresponding interface circuitry, as discussed above). The audio input device 1024 may include any embedded or wired or wirelessly connected device that generates a signal representative of a sound, such as microphones, microphone arrays, or digital instruments (e.g., instruments having a musical instrument digital interface (MIDI) output). The electrical device 1000 may include a Global Navigation Satellite System (GNSS) device 1018 (or corresponding interface circuitry, as discussed above), such as a Global Positioning System (GPS) device. The GNSS device 1018 may be in communication with a satellite-based system and may determine a geolocation of the electrical device 1000 based on information received from one or more GNSS satellites, as known in the art.

The electrical device 1000 may include other output device(s) 1010 (or corresponding interface circuitry, as discussed above). Examples of the other output device(s) 1010 may include an audio codec, a video codec, a printer, a wired or wireless transmitter for providing information to other devices, or an additional storage device.

The electrical device 1000 may include other input device(s) 1020 (or corresponding interface circuitry, as discussed above). Examples of the other input device(s) 1020 may include an accelerometer, a gyroscope, a compass, an image capture device (e.g., monoscopic or stereoscopic camera), a trackball, a trackpad, a touchpad, a keyboard, a cursor control device such as a mouse, a stylus, a touchscreen, proximity sensor, microphone, a bar code reader, a Quick Response (QR) code reader, electrocardiogram (ECG) sensor, PPG (photoplethysmogram) sensor, galvanic skin response sensor, any other sensor, or a radio frequency identification (RFID) reader.

The electrical device 1000 may have any desired form factor, such as a hand-held or mobile electrical device (e.g., a cell phone, a smart phone, a mobile internet device, a music player, a tablet computer, a laptop computer, a 2-in-1 convertible computer, a portable all-in-one computer, a netbook computer, an ultrabook computer, a personal digital assistant (PDA), an ultra mobile personal computer, a portable gaming console, etc.), a desktop electrical device, a server, a rack-level computing solution (e.g., blade, tray or sled computing systems), a workstation or other networked computing component, a printer, a scanner, a monitor, a set-top box, an entertainment control unit, a stationary gaming console, smart television, a vehicle control unit, a digital camera, a digital video recorder, a wearable electrical device or an embedded computing system (e.g., computing systems that are part of a vehicle, smart home appliance, consumer electronics product or equipment, manufacturing equipment). In some embodiments, the electrical device 1000 may be any other electronic device that processes data. In some embodiments, the electrical device 1000 may comprise multiple discrete physical components. Given the range of devices that the electrical device 1000 can be manifested as in various embodiments, in some embodiments, the electrical device 1000 can be referred to as a computing device or a computing system.

While the concepts of the present disclosure are susceptible to various modifications and alternative forms, specific embodiments thereof have been shown by way of example in the drawings and are described herein in detail. It should be understood, however, that there is no intent to limit the concepts of the present disclosure to the particular forms disclosed, but on the contrary, the intention is to cover all modifications, equivalents, and alternatives consistent with the present disclosure and the appended claims.

In the drawings, some structural or method features may be shown in specific arrangements and/or orderings. However, it should be appreciated that such specific arrangements and/or orderings may not be required. Rather, in some embodiments, such features may be arranged in a different manner and/or order than shown in the illustrative figures. Additionally, the inclusion of a structural or method feature in a particular figure is not meant to imply that such feature is required in all embodiments and, in some embodiments, may not be included or may be combined with other features. Further, it should be understood that the various embodiments shown in the figures are illustrative representations and are not necessarily drawn to scale.

Moreover, the illustrations and/or descriptions of various embodiments may be simplified or approximated for ease of understanding, and as a result, they may not necessarily reflect the level of precision nor variation that may be present in actual embodiments. For example, while some figures generally indicate straight lines, right angles, and smooth surfaces, actual implementations of the disclosed embodiments may have less than perfect straight lines and right angles, and some features may have surface topography or otherwise be non-smooth, given real-world limitations of fabrication processes. Similarly, illustrations and/or descriptions of how components are arranged may be simplified or approximated for ease of understanding and may vary by some margin of error in actual embodiments (e.g., due to fabrication processes, etc.).

The terms "over", "to", "between" and "on" as used herein may refer to a relative position of one layer with respect to other layers. One layer "over" or "on" another layer or bonded "to" another layer may be directly in contact with the other layer or may have one or more intervening layers. One layer "between" layers may be directly in contact with the layers or may have one or more intervening layers.

The term "package" generally refers to a self-contained carrier of one or more dice, where the dice are attached to the package substrate, and may be encapsulated for protection, with integrated or wire-bonded interconnects between the dice and leads, pins or bumps located on the external portions of the package substrate. The package may contain a single die, or multiple dice, providing a specific function. The package is usually mounted on a printed circuit board for interconnection with other packaged integrated circuits and discrete components, forming a larger circuit.

The term "cored" generally refers to a substrate of an integrated circuit package built upon a board, card or wafer comprising a non-flexible stiff material. Typically, a small printed circuit board is used as a core, upon which integrated circuit device and discrete passive components may be soldered. Typically, the core has vias extending from one side to the other, allowing circuitry on one side of the core to be coupled directly to circuitry on the opposite side of the core. The core may also serve as a platform for building up layers of conductors and dielectric materials.

The term "coreless" generally refers to a substrate of an integrated circuit package having no core. The lack of a core allows for higher-density package architectures, as the through-vias have relatively large dimensions and pitch compared to high-density interconnects.

The term "land side", if used herein, generally refers to the side of the substrate of the integrated circuit package closest to the plane of attachment to a printed circuit board, motherboard, or other package. This is in contrast to the term "die side", which is the side of the substrate of the integrated circuit package to which the die or dice are attached.

The term "dielectric" generally refers to any number of non-electrically conductive materials that make up the structure of a package substrate. For purposes of this disclosure, dielectric material may be incorporated into an integrated circuit package as layers of laminate film or as a resin molded over integrated circuit dice mounted on the substrate.

The term "metallization" generally refers to metal layers formed over and through the dielectric material of the package substrate. The metal layers are generally patterned to form metal structures such as traces and bond pads. The metallization of a package substrate may be confined to a single layer or in multiple layers separated by layers of dielectric.

The term "bond pad" generally refers to metallization structures that terminate integrated traces and vias in integrated circuit packages and dies. The term "solder pad" may be occasionally substituted for "bond pad" and carries the same meaning.

The term "solder bump" generally refers to a solder layer formed on a bond pad. The solder layer typically has a round shape, hence the term "solder bump".

The term "substrate" generally refers to a planar platform comprising dielectric and metallization structures. The substrate mechanically supports and electrically couples one or more IC dies on a single platform, with encapsulation of the one or more IC dies by a moldable dielectric material. The substrate generally comprises solder bumps as bonding interconnects on both sides. One side of the substrate, generally referred to as the "die side", comprises solder bumps for chip or die bonding. The opposite side of the substrate, generally referred to as the "land side", comprises solder bumps for bonding the package to a printed circuit board.

The term "assembly" generally refers to a grouping of parts into a single functional unit. The parts may be separate and are mechanically assembled into a functional unit, where the parts may be removable. In another instance, the parts may be permanently bonded together. In some instances, the parts are integrated together.

The terms "coupled" or "connected" means a direct or indirect connection, such as a direct electrical, mechanical, magnetic or fluidic connection between the things that are connected or an indirect connection, through one or more passive or active intermediary devices.

The term "circuit" or "module" may refer to one or more passive and/or active components that are arranged to cooperate with one another to provide a desired function. The term "signal" may refer to at least one current signal, voltage signal, magnetic signal, or data/clock signal. The meaning of "a," "an," and "the" include plural references. The meaning of "in" includes "in" and "on."

The vertical orientation is in the z-direction and it is understood that recitations of "top", "bottom", "above" and "below" refer to relative positions in the z-dimension with the usual meaning. However, it is understood that embodiments are not necessarily limited to the orientations or configurations illustrated in the figure.

The terms "substantially," "close," "approximately," "near," and "about," generally refer to being within +/−10% of a target value (unless specifically specified). Unless otherwise specified the use of the ordinal adjectives "first," "second," and "third," etc., to describe a common object, merely indicate that different instances of like objects to which are being referred and are not intended to imply that the objects so described must be in a given sequence, either temporally, spatially, in ranking or in any other manner.

For the purposes of the present disclosure, phrases "A and/or B" and "A or B" mean (A), (B), or (A and B). For the purposes of the present disclosure, the phrase "A, B, and/or C" means (A), (B), (C), (A and B), (A and C), (B and C), or (A, B and C).

Views labeled "cross-sectional", "profile" and "plan" correspond to orthogonal planes within a cartesian coordinate system. Thus, cross-sectional and profile views are taken in the x-z plane, and plan views are taken in the x-y plane. Typically, profile views in the x-z plane are cross-sectional views. Where appropriate, drawings are labeled with axes to indicate the orientation of the figure.

EXAMPLE EMBODIMENTS

Illustrative examples of the technologies described throughout this disclosure are provided below. Embodiments of these technologies may include any one or more, and any combination of, the examples described below. In some embodiments, at least one of the systems or components set forth in one or more of the preceding figures may be configured to perform one or more operations, techniques, processes, and/or methods as set forth in the following examples.

Example 1 includes a package substrate, comprising: a substrate core comprising one or more first dielectric layers, wherein the one or more first dielectric layers comprise hollow glass fibers; a plurality of second dielectric layers, wherein the plurality of second dielectric layers are below and above the substrate core; and one or more conductive traces through the package substrate.

Example 2 includes the package substrate of Example 1, wherein the one or more first dielectric layers further comprise hollow glass cloth, wherein the hollow glass cloth comprises the hollow glass fibers.

Example 3 includes the package substrate of Example 2, wherein the hollow glass cloth has a thermoplastic coating.

Example 4 includes the package substrate of any of Examples 1-3, wherein the one or more first dielectric layers further comprise hollow pockets.

Example 5 includes the package substrate of Example 4, wherein the one or more first dielectric layers further comprise hollow filler particles, wherein the hollow pockets are within the hollow filler particles.

Example 6 includes the package substrate of Example 5, wherein the hollow filler particles comprise hollow silica filler.

Example 7 includes the package substrate of Example 4, wherein the one or more first dielectric layers further comprise cage polymers, wherein the hollow pockets are within the cage polymers.

Example 8 includes the package substrate of Example 7, wherein the cage polymers comprise silesquioxane polymers, phenylsilsequioxane polymers, or polycaprolactone polymers.

Example 9 includes the package substrate of any of Examples 1-8, wherein the substrate core further comprises a plurality of copper foils, wherein the one or more first dielectric layers are between the plurality of copper foils.

Example 10 includes the package substrate of any of Examples 1-9, wherein the plurality of second dielectric layers comprises at least one layer with hollow glass fibers or hollow pockets.

Example 11 includes the package substrate of any of Examples 1-10, wherein one or more conductive traces comprise: one or more through hole vias; and one or more conductive contacts on a surface of the package substrate.

Example 12 includes the package substrate of Example 11, wherein an integrated circuit die is coupled to the one or more conductive contacts on the surface of the package substrate.

Example 13 includes an integrated circuit package, comprising: a package substrate, comprising: a substrate core, wherein the substrate core comprises hollow glass cloth within a first dielectric material; a plurality of buildup layers below and above the substrate core, wherein the plurality of buildup layers comprise a second dielectric material; and one or more conductive traces through the package substrate, wherein the one or more conductive traces comprise one or more conductive contacts on a surface of the package substrate; and one or more integrated circuit dies coupled to the one or more conductive contacts on the surface of the package substrate.

Example 14 includes the integrated circuit package of Example 13, wherein the substrate core further comprises a plurality of copper foils, wherein the first dielectric material is between the plurality of copper foils.

Example 15 includes the integrated circuit package of any of Examples 13-14, wherein the substrate core further comprises hollow pockets within the first dielectric material, wherein the hollow pockets comprise hollow silica filler or cage polymers.

Example 16 includes the integrated circuit package of Example 15, wherein the cage polymers comprise silesquioxane polymers, phenylsilsequioxane polymers, or polycaprolactone polymers.

Example 17 includes the integrated circuit package of any of Examples 13-16, wherein the plurality of buildup layers comprises at least one layer with hollow glass cloth or hollow pockets.

Example 18 includes the integrated circuit package of Examples 13-17, wherein the one or more integrated circuit dies comprise processing circuitry, memory circuitry, or communication circuitry.

Example 19 includes an electronic device, comprising: a printed circuit board; and an integrated circuit package coupled to the printed circuit board, wherein the integrated circuit package comprises: a package substrate, comprising: a substrate core, wherein the substrate core comprises hollow glass cloth within a first dielectric material; a plurality of buildup layers below and above the substrate core, wherein the plurality of buildup layers comprise a second dielectric material; and one or more conductive traces through the package substrate; and one or more integrated circuit dies coupled to the package substrate.

Example 20 includes the electronic device of Example 19, wherein the one or more integrated circuit dies comprise processing circuitry, memory circuitry, or communication circuitry.

Example 21 includes the electronic device of any of Examples 19-20, wherein the substrate core further comprises hollow pockets within the first dielectric material, wherein the hollow pockets comprise hollow silica filler or cage polymers.

Example 22 includes a method of forming a package substrate, comprising: providing a substrate core, wherein the substrate core comprises a first dielectric material and hollow glass fibers within the first dielectric material; forming one or more first conductive traces in the substrate core; forming a plurality of buildup layers below and above the substrate core, wherein the plurality of buildup layers comprise a second dielectric material; forming one or more second conductive traces in the plurality of buildup layers; and forming one or more conductive contacts on a surface of the package substrate.

Example 23 includes the method of Example 22, wherein providing the substrate core comprises forming the substrate core, wherein forming the substrate core comprises: forming a plurality of dielectric layers, wherein at least some of the plurality of dielectric layers comprise the hollow glass fibers within the first dielectric material; and forming a plurality of copper foils below and above the plurality of dielectric layers.

Example 24 includes the method of Example 23, wherein at least some of the plurality of dielectric layers further comprise hollow pockets within the first dielectric material, wherein the hollow pockets comprise hollow silica filler or cage polymers.

Example 25 includes the method of any of Examples 22-24, wherein at least one buildup layer comprises hollow glass cloth, hollow silica filler, or cage polymers within the second dielectric material.

The invention claimed is:

1. A package substrate, comprising:

a substrate core comprising one or more first dielectric layers, wherein the one or more first dielectric layers comprise hollow glass fibers;

a plurality of second dielectric layers, wherein the plurality of second dielectric layers are below and above the substrate core; and one or more conductive traces through the package substrate.

2. The package substrate of claim 1, wherein the one or more first dielectric layers further comprise hollow glass cloth, wherein the hollow glass cloth comprises the hollow glass fibers.

3. The package substrate of claim 2, wherein the hollow glass cloth has a thermoplastic coating.

4. The package substrate of claim 1, wherein the one or more first dielectric layers further comprise hollow pockets.

5. The package substrate of claim 4, wherein the one or more first dielectric layers further comprise hollow filler particles, wherein the hollow pockets are within the hollow filler particles.

6. The package substrate of claim 5, wherein the hollow filler particles comprise hollow silica filler.

7. The package substrate of claim 4, wherein the one or more first dielectric layers further comprise cage polymers, wherein the hollow pockets are within the cage polymers.

8. The package substrate of claim 7, wherein the cage polymers comprise silesquioxane polymers, phenylsilsequioxane polymers, or polycaprolactone polymers.

9. The package substrate of claim 1, wherein the substrate core further comprises a plurality of copper foils, wherein the one or more first dielectric layers are between the plurality of copper foils.

10. The package substrate of claim 1, wherein the plurality of second dielectric layers comprises at least one layer with hollow glass fibers or hollow pockets.

11. The package substrate of claim 1, wherein one or more conductive traces comprise:

one or more through hole vias; and one or more conductive contacts on a surface of the package substrate.

12. The package substrate of claim 11, wherein an integrated circuit die is coupled to the one or more conductive contacts on the surface of the package substrate.

13. The package substrate of claim 1, wherein the hollow glass fibers are configured to reduce a dielectric constant of the substrate core relative to a substrate core comprising solid glass fibers.

14. The package substrate of claim 1, wherein the hollow glass fibers are coated with resin.

15. An integrated circuit package, comprising:

a package substrate, comprising:

a substrate core, wherein the substrate core comprises hollow glass cloth within a first dielectric material;

a plurality of buildup layers below and above the substrate core, wherein the plurality of buildup layers comprise a second dielectric material; and one or more conductive traces through the package substrate, wherein the one or more conductive traces comprise one or more conductive contacts on a surface of the package substrate; and one or more integrated circuit dies coupled to the one or more conductive contacts on the surface of the package substrate.

16. The integrated circuit package of claim 15, wherein the substrate core further comprises a plurality of copper foils, wherein the first dielectric material is between the plurality of copper foils.

17. The integrated circuit package of claim 15, wherein the substrate core further comprises hollow pockets within the first dielectric material, wherein the hollow pockets comprise hollow silica filler or cage polymers.

18. The integrated circuit package of claim 17, wherein the cage polymers comprise silesquioxane polymers, phenylsilsequioxane polymers, or polycaprolactone polymers.

19. The integrated circuit package of claim 15, wherein the plurality of buildup layers comprises at least one layer with hollow glass cloth or hollow pockets.

20. The integrated circuit package of claim 15, wherein the one or more integrated circuit dies comprise processing circuitry, memory circuitry, or communication circuitry.

21. An electronic device, comprising:

a printed circuit board; and an integrated circuit package coupled to the printed circuit board, wherein the integrated circuit package comprises:

a package substrate, comprising:

a substrate core, wherein the substrate core comprises hollow glass cloth within a first dielectric material;

a plurality of buildup layers below and above the substrate core, wherein the plurality of buildup layers comprise a second dielectric material; and one or more conductive traces through the package substrate; and one or more integrated circuit dies coupled to the package substrate.

22. The electronic device of claim 21, wherein the one or more integrated circuit dies comprise processing circuitry, memory circuitry, or communication circuitry.

23. The electronic device of claim 21, wherein the substrate core further comprises hollow pockets within the first dielectric material, wherein the hollow pockets comprise hollow silica filler or cage polymers.

* * * * *